US012753342B2

(12) United States Patent
Narita et al.

(10) Patent No.: US 12,753,342 B2
(45) Date of Patent: Oct. 6, 2026

(54) COMPOSITION AND METHOD FOR TREATING SUBSTRATE

(71) Applicant: FUJIFILM Corporation, Tokyo (JP)

(72) Inventors: Moe Narita, Shizuoka (JP); Atsushi Mizutani, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 336 days.

(21) Appl. No.: 18/468,123

(22) Filed: Sep. 15, 2023

(65) Prior Publication Data

US 2024/0002725 A1 Jan. 4, 2024

Related U.S. Application Data

(63) Continuation of application No. PCT/JP2022/011812, filed on Mar. 16, 2022.

(30) Foreign Application Priority Data

Mar. 17, 2021 (JP) ................................ 2021-043957

(51) Int. Cl.
*C09K 13/06* (2006.01)
*B08B 3/08* (2006.01)
(Continued)

(52) U.S. Cl.
CPC ................ *C09K 13/06* (2013.01); *B08B 3/08* (2013.01); *C23F 1/30* (2013.01); *H10P 70/27* (2026.01); *H10W 20/4432* (2026.01)

(58) Field of Classification Search
CPC .. C09K 13/06; B08B 3/08; C23F 1/30; H01L 21/02068; H01L 23/53242; H01L 21/02063; H01L 21/32134
(Continued)

(56) References Cited

U.S. PATENT DOCUMENTS

| | | | |
|---|---|---|---|
| 2014/0054266 A1 | 2/2014 | Jin et al. | |
| 2020/0190672 A1* | 6/2020 | Ohhashi | C23F 4/00 |

(Continued)

FOREIGN PATENT DOCUMENTS

| | | |
|---|---|---|
| JP | 3619745 B2 | 2/2005 |
| JP | 2015-532005 A | 11/2015 |

(Continued)

OTHER PUBLICATIONS

International Preliminary Report on Patentability issued Sep. 12, 2023 with a Translation of the Written Opinion of the International Searching Authority in Application No. PCT/JP2022/011812.

(Continued)

*Primary Examiner* — Duy N Deo

(74) *Attorney, Agent, or Firm* — Sughrue Mion, PLLC

(57) ABSTRACT

An object of the present invention is to provide a composition that leaves few residues in a case where the composition is brought into contact with a Ru-containing substance to perform an etching treatment on the Ru-containing substance, and to provide a method for treating a substrate. The composition according to an embodiment of the present invention contains one or more periodic acid compounds selected from the group consisting of a periodic acid and a salt thereof, a quaternary ammonium salt represented by Formula (A), and a trialkylamine or a salt thereof.

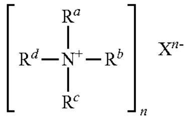

(A)

19 Claims, 5 Drawing Sheets

(51) Int. Cl.

| | |
|---|---|
| ***C23F 1/30*** | (2006.01) |
| ***H10P 70/00*** | (2026.01) |
| *H10W 20/44* | (2026.01) |

(58) Field of Classification Search

USPC .......................................................... 216/100

See application file for complete search history.

(56) References Cited

U.S. PATENT DOCUMENTS

2020/0347299 A1* 11/2020 Takahashi ................. C23F 1/30
2020/0354632 A1* 11/2020 Sugimura ......... H01L 21/02087

FOREIGN PATENT DOCUMENTS

| | | | | |
|---|---|---|---|---|
| JP | 2016092101 A * | 5/2016 | ................ | C23F 1/30 |
| JP | 2020-097765 A | 6/2020 | | |
| TW | 201739909 A | 11/2017 | | |
| TW | 201930581 A | 8/2019 | | |
| WO | 2017/126554 A1 | 7/2017 | | |
| WO | 2019/138814 A1 | 7/2019 | | |
| WO | 2020/054291 A1 | 3/2020 | | |

OTHER PUBLICATIONS

Written Opinion of the International Searching Authority dated May 24, 2022 in International Application No. PCT/JP2022/011812.
International Search Report dated May 24, 2022 in Application No. PCT/JP2022/011812.
Communication issued May 15, 2025 in Chinese Application No. 202280021260.X.
Communication issued Jul. 11, 2025 in Korean Application No. 10-2023-7031438.
Chinese Office Action dated Aug. 14, 2025 in Application No. 202280021260.X.
Taiwanese Office Action dated Sep. 15, 2025 in Application No. 111109632.
Office Action dated Feb. 25, 2026 in Taiwanese Application No. 111109632.
Office Action dated Jan. 13, 2026, issued in Japanese Application No. 2023-507148.
Office Action dated Apr. 14, 2026, issued in Korean application No. 10-2023-7031438.
Office Action dated Apr. 7, 2026, in Japanese Application No. 2023-507148.

* cited by examiner

COMPOSITION AND METHOD FOR TREATING SUBSTRATE

CROSS-REFERENCE TO RELATED APPLICATIONS

This application is a Continuation of PCT International Application No. PCT/JP2022/011812 filed on Mar. 16, 2022, which claims priority under 35 U.S.C. § 119(a) to Japanese Patent Application No. 2021-043957 filed on Mar. 17, 2021. The above applications are hereby expressly incorporated by reference, in their entirety, into the present application.

BACKGROUND OF THE INVENTION

1. Field of the Invention

The present invention relates to a composition and a method for treating a substrate.

2. Description of the Related Art

As the miniaturization of semiconductor products progresses, there is an increasing demand for performing a step of removing unnecessary metal-containing substances on a substrate in a semiconductor manufacturing process with high efficiency and high accuracy.

JP3619745B discloses a treatment method of performing an etching treatment on ruthenium or osmium, the treatment method using a treatment liquid that contains periodic acid having a pH of 2 or more and 10 or less and a temperature of 30° C. or higher and 100° C. or lower.

SUMMARY OF THE INVENTION

In recent years, it has been required that residues after an etching treatment be reduced in a case where an unnecessary metal-containing substance on a substrate is treated with an etchant. The residues after the etching treatment sometimes cause a decrease in yield during manufacturing of semiconductor products. Therefore, with the miniaturization of semiconductor products, the reduction of residues has been more strictly required.

The inventor of the present invention has found that in a case where a Ru (ruthenium)-containing substance disposed on a substrate is treated with the etchant disclosed in JP3619745B, a large amount of residues remain after the treatment, failing to meet the requirements and standards currently expected.

An object of the present invention is to provide a composition that leaves few residues in a case where the composition is brought into contact with a Ru-containing substance to perform an etching treatment on the Ru-containing substance.

Another object of the present invention is to provide a method for treating a substrate.

In order to achieve the above objects, the inventor of the present invention conducted intensive studies. As a result, the inventor has found that the objects are achieved by the following constitutions.

[1] A composition comprising one or more periodic acid compounds selected from the group consisting of a periodic acid and a salt thereof,
 a quaternary ammonium salt represented by Formula (A) that will be described later, and
 a trialkylamine or a salt thereof.

[2] The composition described in [1], in which the composition is used for removing a ruthenium-containing substance on a substrate.

[3] The composition described in [1] or [2], in which the periodic acid compound includes at least one compound selected from the group consisting of orthoperiodic acid, metaperiodic acid, and salts thereof.

[4] The composition described in any one of [1] to [3], in which a content of the periodic acid compound is 0.01% to 5.0% by mass with respect to a total mass of the composition.

[5] The composition described in any one of [1] to [4], in which a total number of ca1rbon atoms contained in the quaternary ammonium salt is 4 to 16.

[6] The composition described in any one of [1] to [5], in which a total number of carbon atoms contained in the quaternary ammonium salt is 4 to 8.

[7] The composition described in any one of [1] to [5], in which the quaternary ammonium salt includes at least one compound selected from the group consisting of a tetramethylammonium salt, a tetraethylammonium salt, a tetrabutylammonium salt, an ethyltrimethylammonium salt, a methyltriethylammonium salt, a diethyldimethylammonium salt, a methyltributylammonium salt, a dimethyldipropylammonium salt, a benzyltrimethylammonium salt, a benzyltriethylammonium salt, a trimethyl(hydroxyethyl)ammonium salt, and a triethyl (hydroxyethyl)ammonium salt.

[8] The composition described in any one of [1] to [7], in which the trialkylamine or a salt thereof is a compound represented by Formula (1) that will be described later or a salt thereof.

[9] The composition described in [8], in which $R^1$, $R^2$, and $R^3$ in Formula (1) each independently represent an alkyl group having 1 to 4 carbon atoms without a substituent.

[10] The composition described in any one of [1] to [9], in which a content of the trialkylamine or a salt thereof is 1.0 ppb by mass to 1.5% by mass with respect to a total mass of the composition.

[11] The composition described in any one of [1] to [10], in which a content of the trialkylamine or a salt thereof is 1.0 ppb by mass to 0.2% by mass with respect to a total mass of the composition.

[12] The composition described in any one of [1] to [11], further comprising a compound having at least one anion selected from the group consisting of $IO_3^-$, $I^-$, and $I_3^-$.

[13] The composition described in [12], in which a mass ratio of a content of the trialkylamine to a total mass of the anion in the compound having the anion is $1\times10^{-5}$ to $1\times10^{5}$.

[14] The composition described in any one of [1] to [13], in which a pH of the composition is 2.0 to 11.0.

[15] The composition described in any one of [1] to [14], in which a pH of the composition is 3.0 to 10.0.

[16] The composition described in any one of [1] to [15], in which a pH of the composition is 4.0 to 8.0.

[17] A method for treating a substrate, comprising a step A of removing a ruthenium-containing substance on a substrate by using the composition described in any one of [1] to [16].

[18] The method for treating a substrate described in [17], in which the step A is a step A1 of performing a recess etching treatment on a ruthenium-containing wiring line or ruthenium-containing liner disposed on a substrate by using the composition, a step A2 of removing a ruthenium-containing film at an outer edge portion of a substrate, on which the ruthenium-containing film is disposed, by using the composition, a step A3 of removing a ruthenium-containing substance attached to a back surface of a substrate, on which a ruthenium-containing film is disposed, by using the composition, a step A4 of removing a ruthenium-containing substance on a substrate, which has undergone dry etching, by using the composition, a step A5 of removing a ruthenium-containing substance on a substrate, which has undergone a chemical mechanical polishing treatment, by using the composition, or a step A6 of removing a ruthenium-containing substance in a region other than a region where a ruthenium-containing film is supposed to be formed on a substrate by using the composition after a ruthenium-containing film is deposited on the region where a ruthenium-containing film is supposed to be formed on the substrate.

According to the present invention, it is possible to provide a composition that leaves few residues in a case where the composition is brought into contact with a Ru-containing substance to perform an etching treatment on the Ru-containing substance.

Furthermore, according to the present invention, it is possible to provide a method for treating a substrate.

DESCRIPTION OF THE PREFERRED EMBODIMENTS

Figure 1:
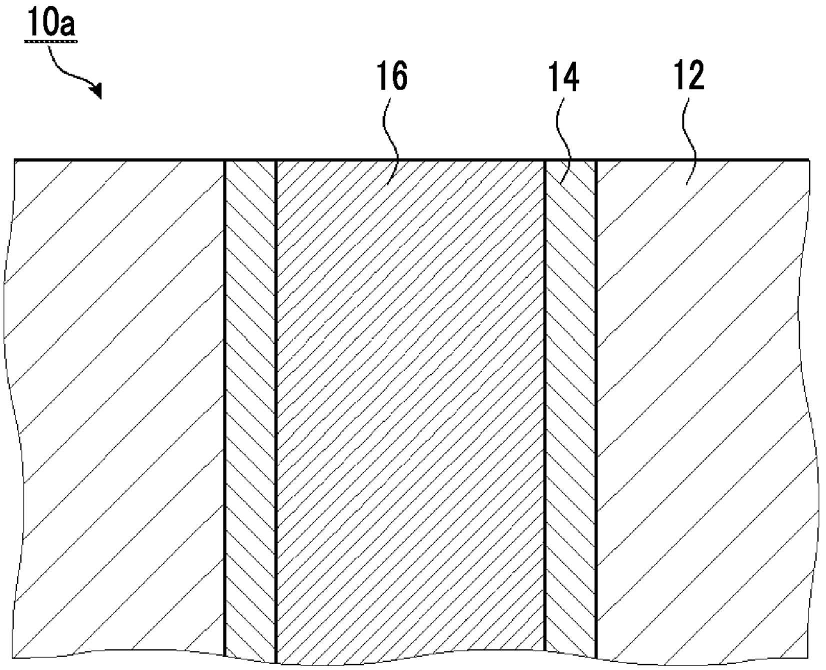
FIG. 1 is a schematic cross-sectional top view showing an example of an object to be treated used in a step A1.

Hereinafter, the present invention will be specifically described.

The following configuration requirements will be described based on typical embodiments of the present invention, but the present invention is not limited to the embodiments.

In the present specification, a range of numerical values described using "to" means a range including the numerical values described before and after "to" as a lower limit and an upper limit.

In the present specification, ppm is an abbreviation for "parts per million" and means $10^{-6}$. Furthermore, in the present specification, ppb is an abbreviation for "parts per billion" and means $10^{-9}$.

In the present specification, in a case where there are two or more components corresponding to a certain component, "content" of such a component means the total content of the two or more components.

"Preparation" includes the preparation of a specific material by synthesis, mixing, or the like and the preparation of a predetermined substance by purchase or the like.

Unless otherwise specified, a compound described in the present specification may include structural isomers (compounds having the same number of atoms and different structures), optical isomers, and isotopes. In addition, a compound may include one isomer and one isotope or two or more isomers and isotopes.

In the present specification, a dry etching residue is a by-product generated as a result of performing dry etching (for example, plasma etching). For example, the dry etching residue refers to an organic residue derived from a photoresist, a Si-containing residue, and a metal-containing residue (for example, a transition metal-containing residue).

Composition

The composition according to an embodiment of the present invention contains one or more periodic acid compounds selected from the group consisting of a periodic acid and a salt thereof (hereinafter, also simply called "periodic acid compound"), a quaternary ammonium salt represented by Formula (A) that will be described later (hereinafter, also called "specific quaternary ammonium salt"), and a trialkylamine or a salt thereof.

The mechanism through which the objects of the present invention are achieved by the use of the composition according to the embodiment of the present invention is unclear. According to the inventors of the present invention, the mechanism is assumed to be as below.

Presumably, in a case where the composition according to an embodiment of the present invention contains a periodic acid compound, a specific quaternary ammonium salt, and a trialkylamine or a salt thereof, these components may have a synergistic action, which may make it possible to reduce residues in a case where the composition according to the embodiment of the present invention is brought into contact with a Ru-containing substance to perform an etching treatment on the Ru-containing substance.

Hereinafter, further reducing residues in a case where the composition is brought into contact with a Ru-containing substance to perform an etching treatment on the Ru-containing substance will be also described as "further improving the effect of the present invention".

Hereinafter, various components contained in the composition will be specifically described.

[Periodic Acid Compound]

The composition according to an embodiment of the present invention contains one or more periodic acid compounds selected from the group consisting of a periodic acid and a salt thereof.

Examples of the periodic acid compound include orthoperiodic acid ($H_5IO_6$), metaperiodic acid ($HIO_4$), and a salt thereof (for example, a sodium salt or a potassium salt). From the viewpoint of further improving the effect of the present invention, the periodic acid compound is preferably orthoperiodic acid or metaperiodic acid.

One periodic acid compound may be used alone, or two or more periodic acid compounds may be used in combination.

From the viewpoint of further improving the effect of the present invention, the content of the periodic acid compound with respect to the total mass of the composition is preferably 0.001% to 15.0% by mass, more preferably 0.01% to 10.0% by mass, even more preferably 0.01% to 5.0% by mass, and particularly preferably 0.1% to 2.0% by mass.

[Specific Quaternary Ammonium Salt]

The composition according to the embodiment of the present invention contains a quaternary ammonium salt represented by Formula (A).

(A)

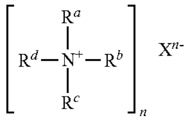

In Formula (A), $R^a$ to $R^d$ each independently represent an alkyl group which may have a substituent.

The alkyl group may be linear, branched, or cyclic, and is preferably linear.

From the viewpoint of further improving the effect of the present invention, the number of carbon atoms in the alkyl group is preferably 1 to 20, more preferably 1 to 15, even more preferably 1 to 10, particularly preferably 1 to 5, and most preferably 1 or 2.

The total number of carbon atoms contained in the specific quaternary ammonium salt is not particularly limited. From the viewpoint of further improving the effect of the present invention, the total number of carbon atoms is preferably 4 to 20, more preferably 4 to 16, and even more preferably 4 to 8.

The total number of carbon atoms contained in the specific quaternary ammonium salt corresponds to the total number of carbon atoms contained in $R^a$ to $R^d$.

Examples of the substituent that the alkyl group has include a hydroxy group, a carboxy group, an amino group, an oxo group, a phosphonic acid group, a sulfo group, an aryl group, a heteroaryl group, and a mercapto group. As the substituent, among these, a hydroxy group or an aryl group is preferable.

The number of substituents that the alkyl group has is preferably 0 to 5, more preferably 0 to 3, and even more preferably 0 or 1.

Examples of $R^a$ to $R^d$ include an alkyl group such as a methyl group, an ethyl group, a propyl group, a butyl group, a dodecyl group, or a tetradodecyl group; a hydroxyalkyl group (an alkyl group having a hydroxy group) such as a hydroxymethyl group, a hydroxyethyl group, or a hydroxybutyl group; and an arylalkyl group (an alkyl group having an aryl group) such as a benzyl group or phenethyl group.

As $R^a$ to $R^d$, among the above, from the viewpoint of further improving the effect of the present invention, an alkyl group, a hydroxyalkyl group, or an arylalkyl group is preferable, and an alkyl group or a hydroxyalkyl group is more preferable.

In Formula (A), $R^a$ to $R^d$ may be the same as or different from each other. Particularly, it is preferable that $R^a$ to $R^d$ be different from each other. That is, it is preferable that all of $R^a$ to $R^d$ be not the same group.

"All of $R^a$ to $R^d$ be not the same group" means that a group consisting of four groups of $R^a$ to $R^d$ includes at least two types of groups. The number of types of groups included in the group consisting of four groups of $R^a$ to $R^d$ may be 2 to 4.

In addition, in a case where the number of carbon atoms vary between groups such as a methyl group and an ethyl group, the groups are considered to be different types of groups. Furthermore, in a case where the number of carbon atoms is the same for groups, such as an n-propyl group and an isopropyl group, but the bonding position thereof varies between the groups, in a case whether or not a substituent is present varies between groups such as an ethyl group and a 2-hydroxyethyl group, and in a case where the position of a substituent varies between groups such as a 2-hydroxypropyl group and a 3-hydroxypropyl group, all of these groups are considered as different groups.

n represents an integer of 1 or 2. $X^{n-}$ represents $Br^-$, $Cl^-$, $F^-$, $CH_3COO^-$, $HSO_4^-$, OH, $NO_3^-$, or $SO_4^{2-}$.

Therefore, in a case where $X^{n-}$ is $Br^-$, $Cl^-$, $F^-$, $CH_3COO^-$, $HSO_4^-$, or $OH^-$, n is 1, and in a case where $X^{n-}$ is $SO_4^{2-}$, n is 2.

Among these, from the viewpoint of further improving the effect of the present invention, $Br^-$, $Cl^-$, $F^-$, or OH is preferable.

Examples of the specific quaternary ammonium salt include a tetramethylammonium salt, a triethyl(hydroxymethyl)ammonium salt, a tetraethylammonium salt, a triethyl (hydroxyethyl)ammonium salt, a tetrabutylammonium salt, a tetrapropylammonium salt, an ethyltrimethylammonium salt, a trimethyl(hydroxyethyl) ammonium salt, a butyltrimethylammonium salt, a trimethyl(hydroxybutyl)ammonium salt, a propyltrimethylammonium salt, an isopropyltrimethylammonium salt, a butyltrimethylammonium salt, a pentyltrimethylammonium salt, a hexyltrimethylammonium salt, an octyltrimethylammonium salt, a dodecyltrimethylammonium salt, a tetradecyltrimethylammonium salt, a hexadecyltrimethylammonium salt, a propyltriethylammonium salt, a butyltriethylammonium salt, a pentyltriethylammonium salt, a hexyltriethylammonium salt, a methyltriethylammonium salt, a methyltripropylammonium salt, a methyltributylammonium salt, a diethyldimethylammonium salt, a bishydroxyethyldimethylammonium salt, a dimethyldipropylammonium salt, a dibutyldimethylammonium salt, a benzyltrimethylammonium salt, and a benzyltriethylammonium salt.

Among these, from the viewpoint of further improving the effect of the present invention, a tetramethylammonium salt, a tetraethylammonium salt, a tetrabutylammonium salt, an ethyltrimethylammonium salt, a diethyldimethylammonium salt, a methyltriethylammonium salt, a diethyldimethylammonium salt, a methyltributylammonium salt, a dimethyldipropylammonium salt, a benzyltrimethylammonium salt, a benzyltriethylammonium salt, a trimethyl(hydroxyethyl)ammonium salt, or a triethyl(hydroxyethyl)ammonium salt is preferable.

One specific quaternary ammonium salt may be used alone, or two or more specific quaternary ammonium salts may be used in combination.

From the viewpoint of further improving the effect of the present invention, the content of the specific quaternary ammonium salt with respect to the total mass of the composition is preferably 0.0001% to 10.0% by mass, more preferably 0.001% to 5.0% by mass, and even more preferably 0.01% to 2.0% by mass.

[Trialkylamine or Salt Thereof]

The composition according to the embodiment of the present invention contains a trialkylamine or a salt thereof.

From the viewpoint of further improving the effect of the present invention, the trialkylamine is preferably a compound represented by Formula (1).

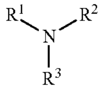

(1)

In Formula (1), R, $R^2$ and $R^3$ each independently represent an alkyl group which may have a substituent.

Examples of the substituent that the alkyl group has include a hydroxy group, a carboxy group, an amino group, an oxo group, a phosphonic acid group, a sulfo group, an aryl group, a heteroaryl group, and a mercapto group. As the substituent, among these, a hydroxy group or an aryl group is preferable.

The number of substituents that the alkyl group has is preferably 0 to 3, more preferably 0 or 1, and even more preferably 0. That is, an alkyl group having no substituent is preferable.

In the alkyl group, the number of carbon atoms including the substituent is preferably 1 to 20, more preferably 1 to 4, and even more preferably 1 or 2.

Examples of the alkyl group represented by $R^1$ to $R^3$ that may have a substituent include an alkyl group such as a methyl group, an ethyl group, a propyl group, a butyl group, a pentyl group, a hexyl group, a dodecyl group, a tetradecyl group, or a hexadecyl group; a hydroxyalkyl group (an alkyl group having a hydroxy group) such as a hydroxymethyl group, a hydroxyethyl group, or a hydroxybutyl group; and an arylalkyl group (an alkyl group having an aryl group) such as a benzyl group or phenethyl group. Among these, an alkyl group is preferable, and a methyl group, an ethyl group, or a butyl group is more preferable.

All of three groups of $R^1$ to $R^3$ may be the same as each other, or two or three groups among $R^1$ to $R^3$ may be different from each other.

Examples of the trialkylamine include trimethylamine, triethylamine, tri-n-propylamine, tri-n-butylamine, ethyldimethylamine, dimethylpropylamine, diethylmethylamine, dimethylhydroxyethylamine, N-methyldiethanolamine, benzyldimethylamine, benzyldiethylamine, diethylhydroxyethylamine, dodecyldimethylamine, tetradecyldimethylamine, and hexadecyldimethylamine.

Among these, from the viewpoint of further improving the effect of the present invention, trimethylamine, triethylamine, tri-n-butylamine, ethyldimethylamine, dimethylpropylamine, and diethylmethylamine are preferable.

The salt of the trialkylamine corresponds to a so-called tertiary ammonium salt, and examples thereof include a salt of a trialkylamine and an inorganic acid and a salt of a trialkylamine and an organic acid. Among these, a salt of the compound represented by Formula (1) and an inorganic acid or a salt of the compound represented by Formula (1) and an organic acid is preferable.

Examples of the salt of the trialkylamine (or the compound represented by Formula (1)) and an inorganic acid include salts of an inorganic acid such as hydrochloric acid, nitric acid, sulfuric acid, phosphoric acid, hydrobromic acid, hydrofluoric acid, hydroiodic acid, or perchloric acid and the trialkylamine (or the compound represented by Formula (1)). Here, the above inorganic acid does not include the aforementioned periodic acid.

Examples of the salt of the trialkylamine (or the compound represented by Formula (1)) and an organic acid include salts of an organic acid such as acetic acid, trifluoroacetic acid, trichloroacetic acid, propionic acid, oxalic acid, maleic acid, citric acid, fumaric acid, lactic acid, malic acid, succinic acid, tartaric acid, gluconic acid, ascorbic acid, or methanesulfonic acid and the trialkylamine (or a compound represented by Formula (1)).

The salt of the trialkylamine (or the compound represented by Formula (1)) may be separated into a cation and an anion in the composition.

One trialkylamine or one trialkylamine salt may be used alone, or two or more trialkylamines or two or more trialkylamine salts may be used in combination.

From the viewpoint of further improving the effect of the present invention, the content of the trialkylamine or a salt thereof with respect to the total mass of the composition is preferably 0.01 ppb by mass to 1.5% by mass, more preferably 1.0 ppb by mass to 1.5% by mass, even more preferably 1.0 ppb by mass to 0.2% by mass, and particularly preferably 1.0 ppb by mass to 0.01% by mass.

[Optional Components]

The composition according to the embodiment of the present invention may contain optional components in addition to the aforementioned components contained in the composition.

Examples of the optional components include a compound having at least one anion selected from the group consisting of $IO_3^-$, $I^-$, and $I_3^-$ (hereinafter, the compound will be also called "compound X"), a solvent, a pH adjuster, a water-soluble polymer, a surfactant, a metal corrosion inhibitor, and a metal component.

(Compound X)

The composition according to the embodiment of the present invention may contain a compound X having at least one anion selected from the group consisting of $IO_3^-$, $I^-$, and $I_3^-$.

Usually, the compound X is a compound composed of an anion and a cation. The compound X corresponds to a compound which can supply $IO_3^-$, $I^-$, or $I_3^-$ by dissociating in a solvent. Note that $I_3^-$ can turn into $I^-$ by equilibrium.

The composition according to the embodiment of the present invention may contain only a compound containing $IO_3^-$, only a compound containing $I^-$, only a compound containing $I_3^-$, or a mixture of these. Particularly, the composition according to the embodiment of the present invention preferably contains a compound containing $IO_3^-$.

As the compound X, a compound that dissociates in an aqueous solution is preferable.

Examples of the compound X include compounds represented by $ZIO_3$, ZI, or $ZI_3$. Herein, Z represents a cation in the compound.

The cation of the compound X is not particularly limited, and examples thereof include a tetraalkylammonium cation such as a tetramethylammonium cation, a tetraethylammonium cation, a tetrabutylammonium cation, an ethyltrimethylammonium cation, a methyltriethylammonium cation, a diethyldimethylammonium cation, a methyltributylammonium cation, a dimethyldipropylammonium cation, a benzyltrimethylammonium cation, a benzyltriethylammonium cation, a trimethyl(hydroxyethyl)ammonium cation, a triethyl(hydroxyethyl)ammonium cation, a dodecyltrimethylammonium cation, a tetradecyltrimethylammonium cation, or a hexadecyltrimethylammonium cation, and a hydrogen cation.

One compound X may be used alone, or two or more compounds X may be used in combination.

The content of the compound X is not particularly limited. From the viewpoint of further improving the effect of the present invention, the content of the compound X with respect to the total mass of the composition is preferably 0.01 ppb by mass to 10% by mass, more preferably 1 ppb by mass to 1% by mass, and even more preferably 5 ppm by mass to 0.1% by mass.

The mass ratio of the content of the trialkylamine or a salt thereof to the total mass of the anion of the compound X is not particularly limited. The mass ratio is often $1\times10^{-6}$ to $1\times10^{6}$, and preferably $1\times10^{-5}$ to $1\times10^{5}$ from the viewpoint of further improving the effect of the present invention.

(Solvent)

The composition according to the embodiment of the present invention may contain a solvent.

Examples of the solvent include water and an organic solvent. Among these, water is preferable.

As water, water having undergone a purification treatment such as distilled water, deionized water, or ultrapure water is preferable, and ultrapure water used for manufacturing semiconductors is more preferable. Water to be incorporated into the composition may contain a trace of components that are unavoidably mixed in.

The content of water with respect to the total mass of the composition is preferably 50% by mass or more, more preferably 65% by mass or more, and even more preferably 75% by mass or more. The upper limit thereof is not particularly limited. The upper limit with respect to the total mass of the composition is preferably 99.999% by mass or less, and more preferably 99.9% by mass or less.

As the organic solvent, a water-soluble organic solvent is preferable. The water-soluble organic solvent refers to an organic solvent that can be mixed with water at an arbitrary ratio.

Examples of the water-soluble organic solvent include an ether-based solvent, an alcohol-based solvent, a ketone-based solvent, an amide-based solvent, a sulfur-containing solvent, and a lactone-based solvent.

Examples of the ether-based solvent include diethyl ether, diisopropyl ether, dibutyl ether, t-butyl methyl ether, cyclohexyl methyl ether, tetrahydrofuran, diethylene glycol, dipropylene glycol, triethylene glycol, polyethylene glycol, alkylene glycol monoalkyl ether (ethylene glycol monomethyl ether, ethylene glycol monobutyl ether, propylene glycol monomethyl ether, diethylene glycol monomethyl ether, dipropylene glycol monomethyl ether, tripropylene glycol monomethyl ether, and diethylene glycol monobutyl ether), and alkylene glycol dialkyl ether (diethylene glycol diethyl ether, diethylene glycol dipropyl ether, diethylene glycol dibutyl ether, triethylene glycol diethyl ether, tetraethylene glycol dimethyl ether, tetraethylene glycol diethyl ether, ethylene glycol dimethyl ether, diethylene glycol dimethyl ether, and triethylene glycol dimethyl ether).

The number of carbon atoms in the ether-based solvent is preferably 3 to 16, more preferably 4 to 14, and even more preferably 6 to 12.

Examples of the alcohol-based solvent include methanol, ethanol, 1-propanol, 2-propanol, 1-butanol, 2-butanol, ethylene glycol, propylene glycol, glycerin, 1,6-hexanediol, cyclohexanediol, sorbitol, xylitol, 2-methyl-2,4-pentanediol, 1,3-butanediol, and 1,4-butanediol.

The number of carbon atoms in the alcohol-based solvent is preferably 1 to 8, and more preferably 1 to 4.

Examples of the amide-based solvent include formamide, monomethylformamide, dimethylformamide, acetamide, monomethylacetamide, dimethylacetamide, monoethylacetamide, diethylacetamide, and N-methylpyrrolidone.

Examples of the ketone-based solvent include acetone, methyl ethyl ketone, methyl isobutyl ketone, and cyclohexanone.

Examples of the sulfur-containing solvent include dimethyl sulfone, dimethyl sulfoxide, and sulfolane.

Examples of the lactone-based solvent include γ-butyrolactone and δ-valerolactone.

One organic solvent may be used alone, or two or more organic solvents may be used in combination.

The content of the organic solvent is preferably 0.1% to 10% by mass with respect to the total mass of the composition.

In a case where two or more organic solvents are used, the total content of two or more organic solvents is also preferably within the above range.

(pH Adjuster)

The composition according to an embodiment of the present invention may contain a pH adjuster.

Examples of the pH adjuster include a basic compound and an acidic compound. The pH adjuster is appropriately selected depending on the target pH of the composition.

Here, the specific quaternary ammonium salt and the trialkylamine or a salt thereof described above are not included in the basic compound. In addition, a periodic acid compound is not included in the acidic compound.

<Basic Compound>

The basic compound is a compound that exhibits alkalinity (pH higher than 7.0) in an aqueous solution.

Examples of the basic compound include an organic base, an inorganic base, and a salt of these.

Examples of the organic base include an amine compound, an alkanolamine compound and a salt thereof, an amine oxide compound, a nitro compound, a nitroso compound, an oxime compound, a ketoxime compound, an aldoxime compound, a lactam compound, and an isocyanide compound. The amine compound means a compound that has an amino group in the molecule and is not included in the alkanolamine, amine oxide compound, and lactam compound described above.

Here, the aforementioned organic base does not include the specific quaternary ammonium salt and the trialkylamine or a salt thereof described above.

Examples of the amine compound include a primary amine having a primary amino group ($-NH_2$) in the molecule, a secondary amine having a secondary amino group (>NH) in the molecule, an alicyclic amine compound having an alicyclic ring (non-aromatic ring) structure having a nitrogen atom in the molecule, and salts of these. The alicyclic ring in the alicyclic amine compound may be a monocyclic or polycyclic ring. In addition, the alicyclic ring may contain a heteroatom (for example, a nitrogen atom, an oxygen atom, or a sulfur atom). The alicyclic ring may have a substituent. There is no particular limitation on the substituent that the alicyclic ring may have, and examples thereof include an alkyl group, an arylalkyl group, a hydroxyalkyl group, and an aminoalkyl group.

Examples of the salt of the amine compound include salts with the acids exemplified above for the trialkylamine or a salt thereof. Among these, a hydrochloride, a sulfate, or a nitrate is preferable.

In addition, the amine compound is preferably water-soluble, and the amount of the amine compound dissolving in 1 L of water is preferably 50 g or more.

Examples of primary amine include methylamine, ethylamine, propylamine, butylamine, pentylamine, methoxyethylamine, methoxypropylamine, and tetrahydrofurfurylamine.

Examples of the secondary amine include dimethylamine, diethylamine, dipropylamine, and dibutylamine (DBA).

Examples of the alicyclic amine compound include 1,8-diazabicyclo[5.4.0]-7-undecene (DBU), 1,4-diazabicyclo [2.2.2]octane (DABCO), N-(2-aminoethyl)piperazine, hydroxyethyl piperazine, piperazine, 2-methylpiperazine, trans-2,5-dimethylpiperazine, cis-2,6-dimethylpiperazine, 2-piperidinemethanol, cyclohexylamine, and 1,5-diazabicyclo[4,3,0]-5-nonene.

Examples of the lactam compound include F-caprolactam.

Examples of the inorganic base include alkali metal hydroxides such as sodium hydroxide and potassium hydroxide, alkaline earth metal hydroxides, and ammonia or a salt thereof.

<Acidic Compound>

The acidic compound is an acidic compound that exhibits acidity (pH of less than 7.0) in an aqueous solution.

Examples of the acidic compound include an inorganic acid, an organic acid, and a salt of these.

Examples of the inorganic acid include sulfuric acid, hydrochloric acid, phosphoric acid, nitric acid, hydrofluoric acid, perchloric acid, hypochlorous acid, and salts thereof. As the inorganic acid, sulfuric acid, hydrochloric acid, phosphoric acid, or nitric acid is preferable, and nitric acid, sulfuric acid, or hydrochloric acid is more preferable.

Examples of organic acid include carboxylic acid, sulfonic acid, and salts thereof.

Examples of the carboxylic acid include lower aliphatic monocarboxylic acids (having one to four carbon atoms) such as formic acid, acetic acid, propionic acid, and butyric acid, and salts thereof.

Examples of the sulfonic acid include methanesulfonic acid, benzenesulfonic acid, p-toluenesulfonic acid (tosylic acid), and a salt of these.

As the acidic compound, sulfuric acid, hydrochloric acid, phosphoric acid, nitric acid, or sulfonic acid or salts thereof are preferable, and sulfuric acid, hydrochloric acid, phosphoric acid, methanesulfonic acid, or p-toluenesulfonic acid is more preferable.

One pH adjuster may be used alone, or two or more pH adjusters may be used in combination.

The content of the pH adjuster with respect to the total mass of the composition is preferably 0.1% by mass or more, and more preferably 0.5% by mass or more. The upper limit thereof is not particularly limited, and is preferably 20% by mass or less with respect to the total mass of the composition.

It is also preferable to adjust the content of the pH adjuster within the aforementioned suitable range such that the pH of the composition falls into the suitable range which will be described later.

(Water-Soluble Polymer)

The composition according to the embodiment of the present invention may contain a water-soluble polymer. Here, the water-soluble polymer does not include the compound included in the metal corrosion inhibitor that will be described later.

Examples of the water-soluble polymer include polyacrylic acid, polyvinyl alcohol, polyethylene glycol, polyethylene oxide, a carboxyvinyl polymer, and the like.

(Surfactant)

The composition according to the embodiment of the present invention may contain a surfactant.

The surfactant is not particularly limited as long as it is a compound having a hydrophilic group and a hydrophobic group (lipophilic group) in one molecule. Examples of the surfactant include an anionic surfactant, a cationic surfactant, and a nonionic surfactant.

The hydrophobic group of the surfactant is not particularly limited, and examples thereof include an aliphatic hydrocarbon group, an aromatic hydrocarbon group, and a combination of these.

In a case where the hydrophobic group has an aromatic hydrocarbon group, the number of carbon atoms in the hydrophobic group is preferably 6 or more, and more preferably 10 or more.

In a case where the hydrophobic group does not include an aromatic hydrocarbon group and is composed of only an aliphatic hydrocarbon group, the number of carbon atoms in the hydrophobic group is preferably 8 or more, and more preferably 10 or more. The upper limit of the number of carbon atoms in the hydrophobic group is not particularly limited, and is preferably 24 or less, and more preferably 20 or less.

Examples of the anionic surfactant include an anionic surfactant having at least one hydrophilic group selected from the group consisting of a sulfonic acid group, a carboxy group, a sulfuric acid ester group, and a phosphonic acid group in the molecule.

Examples of the anionic surfactant having a sulfonic acid group include alkylsulfonic acid, alkylbenzenesulfonic acid, alkylnaphthalenesulfonic acid, alkyldiphenylether sulfonic acid, fatty acid amide sulfonic acid, polyoxyethylene aryl ether sulfonic acid, polyoxyethylene alkyl ether sulfonic acid, polycyclic phenyl ether sulfate, and salts thereof.

Examples of the anionic surfactant having a phosphonic acid group include polyoxypropylene alkyl ether phosphonic acid, polyoxyethylene alkyl ether phosphonic acid, and salts thereof.

Examples of the anionic surfactant having a carboxy group include polyoxyethylene alkyl ether carboxylic acid, polyoxyethylene alkyl ether acetic acid, polyoxyethylene alkyl ether propionic acid, a fatty acid, and salts thereof.

Examples of salts of the anionic surfactant include an ammonium salt, a sodium salt, a potassium salt, and a tetramethylammonium salt.

The cationic surfactant is not particularly limited as long as it is a compound having a cationic hydrophilic group and the aforementioned hydrophobic group. Examples of the cationic surfactant include an alkylpyridium-based surfactant and an alkylamine acetate-based surfactant.

One surfactant may be used alone, or two or more surfactants may be used in combination.

The content of the surfactant with respect to the total mass of the composition is preferably 0.01% by mass or more, and more preferably 0.03% by mass or more. The upper limit thereof is not particularly limited. From the viewpoint of suppressing foaming of the composition, the upper limit of the content of the surfactant with respect to the total mass of the composition is preferably 10% by mass or less, and more preferably 5% by mass or less.

(Abrasive Particles)

It is preferable that the composition according to the embodiment of the present invention substantially do not contain abrasive particles.

The abrasive particles mean particles that are contained in a polishing liquid used for performing a polishing treatment on a semiconductor substrate and have an average primary particle diameter of 5 nm or more.

For the composition according to the embodiment of the present invention, "substantially do not contain abrasive particles" means that in a case where the composition is measured using a commercially available measurement device for a light scattering-type particle measurement method in a liquid, the number of abrasive particles having an average primary particle diameter of 5 nm or more contained in 1 mL of the composition is 10 or less.

Examples of the abrasive particles include inorganic abrasive grains such as silica (including colloidal silica and fumed silica), alumina, zirconia, ceria, titania, germania, manganese oxide, and silicon carbide; and organic abrasive grains such as polystyrene, polyacryl, and polyvinyl chloride.

The content of the abrasive particles is measured using a commercially available measurement device for a light scattering-type particle measurement method in a liquid by using a laser as a light source.

The average primary particle diameter of particles such as abrasive particles is determined by measuring particle diameters (equivalent circle diameter) of 1,000 primary particles randomly selected from an image obtained using a transmission electron microscope TEM2010 (acceleration voltage 200 kV) manufactured by JEOL Ltd., and calculating the arithmetic mean thereof. The equivalent circle diameter is the diameter of a virtual perfect circle assumed to have the same projected area as the projected area of a particle observed.

Examples of the method for removing the abrasive particles from the composition include a purification treatment such as filtering.

(Metal Corrosion Inhibitor)

The composition according to the embodiment of the present invention may contain a metal corrosion inhibitor.

The type of metal corrosion inhibitor is not particularly limited, and a known metal corrosion inhibitor can be used.

As the metal corrosion inhibitor, a metal corrosion inhibitor containing a nitrogen atom is preferable. Examples thereof include a resin containing a nitrogen atom in the repeating unit and a chelating agent, which will be specifically described later.

Examples of the resin containing a nitrogen atom in the repeating unit include polyvinylamide, polyallylamine, polyacrylamide, polyethyleneimine, polyalkylene polyamine, and polyvinylpyrrolidone.

In addition, the resin containing a nitrogen atom may be the following resin (B).

<Resin (B)>

The resin (B) has a first repeating unit having at least one specific amino group that will be described later and a second repeating unit different from the first repeating unit.

The first repeating unit contained in the resin (B) has at least one group (hereinafter, also described as "specific amino group") selected from the group consisting of a primary amino group ($—NH_2$), a secondary amino group (—NH—), a tertiary amino group (>N—), and a quaternary ammonium cation ($>N^+<$).

The first repeating unit is not particularly limited as long as it is a repeating unit that has at least one specific amino group and constitutes the main chain of the resin (B).

The chelating agent that will be specifically described later is not included in the resin (B).

In the first repeating unit, the aforementioned specific amino group and an acid selected from an inorganic acid and an organic acid may form a salt. That is, the first repeating unit contained in the resin (B) has at least one group selected from the group consisting of a primary amino group, a secondary amino group, a tertiary amino group, a quaternary ammonium cation, and a salt consisting of the above ones and an inorganic or organic acid.

Examples of the inorganic acid include hydrochloric acid, sulfuric acid, phosphoric acid, and nitric acid. Examples of the organic acid include acetic acid, propionic acid, methanesulfonic acid, and ethanesulfonic acid.

In a case where the specific amino group is a salt, the salt is preferably a salt with hydrochloric acid, acetic acid, propionic acid, methanesulfonic acid, or ethanesulfonic acid, and more preferably a salt with hydrochloric acid, acetic acid, or ethanesulfonic acid.

In a case where the specific amino group is a quaternary ammonium cation, the specific amino group forms a salt with a counterion corresponding to the aforementioned inorganic or organic acid.

The number of specific amino groups contained in the first repeating unit is not particularly limited, and is preferably 1 to 4, more preferably 1 or 2, and even more preferably 1.

Furthermore, in a case where the specific amino group contained in the first repeating unit is a secondary amino group, a tertiary amino group, or a quaternary ammonium cation, there is no particular limitation on one, two, or three substituents that each of these has on a nitrogen atom. The substituent is preferably an aliphatic hydrocarbon group, more preferably a linear or branched alkyl group having 1 to 6 carbon atoms, and even more preferably a methyl group or an ethyl group.

The specific amino group contained in the first repeating unit is preferably a primary amino group, a secondary amino group, or a tertiary amino group, and more preferably a primary amino group.

Examples of the first repeating unit include a repeating unit represented by Formula (B-1).

$$-Q_1(X_1)_i— \quad (B-1)$$

In Formula (B-1), $Q_1$ represents a (2+i)-valent aliphatic hydrocarbon group having 2 to 4 carbon atoms. $X_1$ represents a monovalent group having at least one specific amino group, and i represents 1 or 2. In a case where i represents 2, two $X_1$'s may be linked to each other to form a ring structure having at least one specific amino group, together with at least a part of $Q_1$.

$X_1$ may be a group consisting of only the specific amino group or may be a group consisting of the specific amino group and a linking group L.

The linking group L is not particularly limited as long as it is a group having a valence corresponding to the number of specific amino groups. Examples of the linking group L include an aliphatic hydrocarbon group and a group which is formed by the substitution of a methylene group contained in an aliphatic hydrocarbon group with a group selected from the group consisting of —O—, —CO—, —NH—, and —NR— (R represents an aliphatic hydrocarbon group).

The linking group L is preferably a linear or branched alkyl group or a group formed by the removal of as many hydrogen atoms as the number of specific amino groups to be substituted from a group which is formed by the substitution of methylene groups contained in the aforementioned alkyl group with —O—, —CO—, or —NH—. The linear or branched alkyl group preferably has 1 to 8 carbon atoms, and more preferably has 1 to 4 carbon atoms. The linking group L is more preferably a methylene group or an ethylene group, and even more preferably a methylene group.

Examples of the ring structure formed of the two linked $X_1$'s with at least a part of $Q_1$ include nitrogen-containing 5- to 7-membered heterocyclic rings. Among these, a pyrrolidine ring, a pyrrolidinium ring, a 1-pyrroline ring, or a piperidine ring is preferable, and a pyrrolidine ring or a pyrrolidinium ring is more preferable.

The aliphatic hydrocarbon group represented by $Q_1$ is preferably an ethylene group, a propylene group, a trimethylene group, or a tetramethylene group, and more preferably an ethylene group.

The substituent which may be contained in the aliphatic hydrocarbon group represented by $Q_1$ is preferably an aliphatic hydrocarbon group, more preferably a linear or branched alkyl group having 1 to 4 carbon atoms, even more preferably a methyl group or an ethyl group, and particularly preferably a methyl group.

i preferably represents 1.

The first repeating unit is preferably a repeating unit represented by Formula (1b).

(1b)

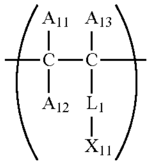

In Formula (1b), $X_{11}$ represents a specific amino group, $L_1$ represents a single bond or a divalent linking group, and $A_{11}$, $A_{12}$, and $A_{13}$ each independently represent a hydrogen atom or a linear or branched alkyl group having 1 to 4 carbon atoms.

The preferred aspect of the specific amino group represented by $X_{11}$ is as described above.

The divalent linking group represented by $L_1$ is as described above for the linking group L, including the preferred aspect thereof. $L_1$ is preferably a single bond or a linear or branched alkylene group having 1 to 4 carbon atoms, more preferably a single bond, a methylene group, or an ethylene group, and even more preferably a single bond or a methylene group.

A1, $A_{12}$, and $A_{13}$ are preferably a hydrogen atom, a methyl group, or an ethyl group, and more preferably a hydrogen atom.

The content of the first repeating unit with respect to all repeating units in the resin (B) is preferably 1 to 99 mol %, more preferably 5 to 95 mol %, even more preferably 15 to 85 mol %, and particularly preferably 25 to 75 mol %.

The resin (B) has a second repeating unit different from the first repeating unit.

"Different from the first repeating unit" means that, for example, the second repeating unit does not have the group that the first repeating unit has as the specific amino group and/or there is a difference in the main chain structure or in the structure of the linking group linking the main chain and the specific amino group between the first repeating unit and the second repeating unit.

The second repeating unit may have a specific amino group different from the specific amino group that the first repeating unit actually has. In addition, the second repeating unit may have the same specific amino group as the first repeating unit, as long as the main chain structure or side chain structure of the second repeating unit is different from that of the first repeating unit. It is preferable that the second repeating unit have a hydrophilic group different from the specific amino group that the first repeating unit actually has.

It is preferable that the second repeating unit have at least one hydrophilic group.

The number of hydrophilic groups contained in the second repeating unit is not particularly limited, and is preferably 1 to 5, more preferably 1 to 3, and even more preferably 1 or 2.

Examples of the hydrophilic group include the specific amino group, a carboxy group, a hydroxy group, an alkoxy group, a polyoxyalkylene group, an amide group, a carbamoyl group, a nitrile group, a sulfo group, a sulfonyl group, a sulfonamide group, and a sulfamoyl group.

Examples of the polyoxyalkylene group include a polyoxyethylene group, a polyoxypropylene group, and a polyoxyalkylene group in which an oxyethylene group and an oxypropylene group are bonded in blocks or bonded randomly. Among these, polyoxyethylene or polyoxypropylene is preferable, and polyoxyethylene is more preferable.

The number of repetitions of the oxyalkylene group in the polyoxyalkylene group is not particularly limited, and is preferably 1 to 30 and more preferably 1 to 10.

The aforementioned hydrophilic group may form a salt. The salt of the specific amino group is as described above in the section of the first repeating unit. Examples of the salt of a carboxy group and a sulfo group include alkali metal salts thereof.

The aforementioned hydrophilic group may further have a substituent. Examples of the substituent that may be contained in the hydrophilic group include an aliphatic hydrocarbon group and the aforementioned hydrophilic group. Among these, a linear or branched alkyl group having 1 to 4 carbon atoms is preferable, a methyl group or an ethyl group is more preferable, and a methyl group is even more preferable.

The hydrophilic group contained in the second repeating unit is preferably a hydroxy group, a carboxy group, a primary amino group, a secondary amino group, a tertiary amino group, an amide group, a polyoxyalkylene group, a sulfo group, or a sulfonyl group, more preferably a primary amino group, a carboxy group, a hydroxy group, or a polyoxyethylene group, and even more preferably a carboxy group.

Examples of the second repeating unit include a repeating unit represented by Formula (B-2).

$$-(Q_2(X_2)_j)— \qquad \text{(B-2)}$$

In Formula (B-2), $Q_2$ represents a (2+j)-valent aliphatic hydrocarbon group having 2 to 4 carbon atoms. $X_2$ represents a monovalent group having at least one hydrophilic group, and j represents 1 or 2. In a case where j represents 2, two $X_2$'s may be linked to each other to form a ring structure having at least one hydrophilic group, together with at least a part of $Q_2$.

$X_2$ may be a group consisting of only a hydrophilic group or may be a group consisting of a hydrophilic group and the linking group L.

The linking group L has the same definition as the linking group L in Formula (1), including the preferred aspect thereof.

Examples of the ring structure formed of the two linked $X_2$'s with at least a part of $Q_2$ include nitrogen-containing 5- to 7-membered heterocyclic rings. Among these, a pyrrolidine ring, a pyrrolidinium ring, a 1-pyrroline ring, or a piperidine ring is preferable, and a pyrrolidine ring or a pyrrolidinium ring is more preferable.

The aliphatic hydrocarbon group represented by $Q_2$ is preferably an ethylene group, a propylene group, a trimethylene group, or a tetramethylene group, and more preferably an ethylene group.

Examples of the substituent which may be contained in the aliphatic hydrocarbon group represented by $Q_2$ include an aliphatic hydrocarbon group. The substituent is preferably a linear or branched alkyl group having 1 to 4 carbon atoms, more preferably a methyl group or an ethyl group, and even more preferably a methyl group.

j preferably represents 1.

The second repeating unit may be a divalent hydrophilic group. Examples of the divalent hydrophilic group as the second repeating unit include a sulfonyl group.

The second repeating unit is preferably a repeating unit represented by Formula (2b).

(2b)

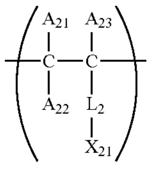

In Formula (2b), $A_{21}$, $A_{22}$, and $A_{23}$ each independently represent a hydrogen atom, a linear or branched alkyl group having 1 to 4 carbon atoms, or $-L_2-X_{21}$. $X_{21}$ represents a hydrophilic group. $L_2$ represents a single bond or a divalent linking group. In a case where the repeating unit has two or more $X_{21}$'s and two or more $L_2$'s, $X_{21}$'s may be the same as or different from each other, and $L_2$'s may be the same as or different from each other.

The preferred aspect of the hydrophilic group represented by $X_{21}$ is as described above.

The divalent linking group represented by $L_2$ is as described above for the linking group L, including the preferred aspect thereof. $L_2$ is preferably a single bond or a linear or branched alkylene group having 1 to 4 carbon atoms, more preferably a single bond, a methylene group, or an ethylene group, and even more preferably a single bond or a methylene group.

It is preferable that $A_{21}$, $A_{22}$, and $A_{23}$ each independently represent a hydrogen atom or a linear or branched alkyl group having 1 to 4 carbon atoms, or that one of $A_{21}$, $A_{22}$, or $A_{23}$ represent $-L_2-X_{21}$ and other two represent a hydrogen atom or a linear or branched alkyl group having 1 to 4 carbon atoms.

Particularly, it is more preferable that $A_{21}$, $A_{22}$, and $A_{23}$ each independently represent a hydrogen atom, a methyl group, or an ethyl group, or that one of $A_{21}$, $A_{22}$, and $A_{23}$ represent a hydrophilic group and other two represent a hydrogen atom, a methyl group, or an ethyl group. It is even more preferable that $A_{21}$, $A_{22}$, and $A_{23}$ each independently represent a hydrogen atom or a methyl group, or that one of $A_{21}$, $A_{22}$, and $A_{23}$ represent a carboxy group and other two represent a hydrogen atom or a methyl group.

The content of the second repeating unit with respect to all repeating units in the resin (B) is preferably 1 to 99 mol %, more preferably 5 to 95 mol %, even more preferably 15 to 85 mol %, and particularly preferably 25 to 75 mol %.

One second repeating unit may be used alone, or two or more second repeating units may be combined. In a case where the resin (B) has two or more second repeating units, it is preferable that the resin (B) have at least one repeating unit represented by Formula (B-2) or Formula (2b).

The content of the repeating unit represented by Formula (B-2) or Formula (2b) with respect to all repeating units in the resin (B) is preferably 1 to 99 mol %, more preferably 5 to 95 mol %, even more preferably 15 to 85 mol %, and particularly preferably 25 to 75 mol %.

There is no particular limitation on the ratio between the first repeating unit and the second repeating unit in the resin (B). From the viewpoint of further improving anticorrosion properties for a metal-containing layer (particularly, a tungsten-containing layer), a ratio of the number of moles m of the first repeating unit to the number of moles n of the second repeating unit (m/n) is preferably 20/1 to 1/20, more preferably 10/1 to 1/10, even more preferably 5/1 to 1/5, and particularly preferably 3/1 to 1/3.

Specific examples of the resin (B) include resins having skeleton structures represented by Formulae (P-1) to (P-23). In Formulae (P-1) to (P-23), the repeating unit designated by the reference numeral m is the first repeating unit, and the repeating unit designated by the reference numeral n is the second repeating unit.

Note that a plurality of repeating units is described in the skeleton structures represented by Formulae (P-1) to (P-23), and there is no particular limitation on the way the plurality of repeating units is bonded. For example, the plurality of repeating units may be bonded randomly (so-called random copolymer), alternately bonded (so-called alternating copolymer), or bonded in blocks (so-called block copolymer).

(P-1)

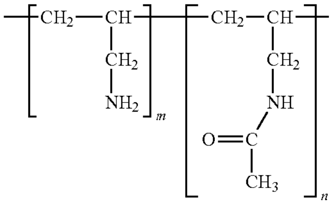

(P-2)

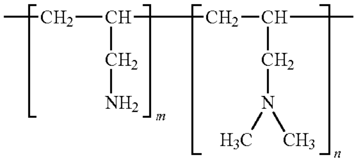

(P-3)

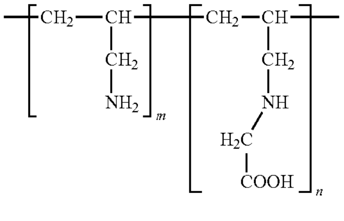

(P-4)

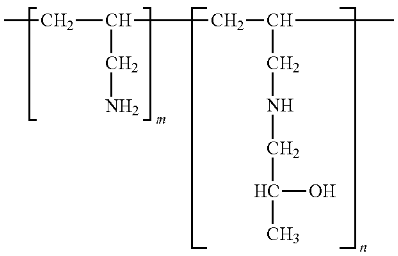

-continued
(P-5)
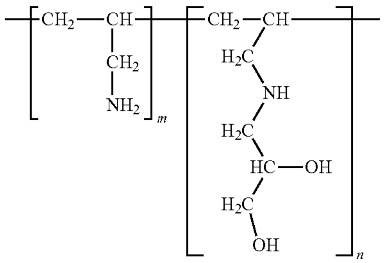
(P-6)
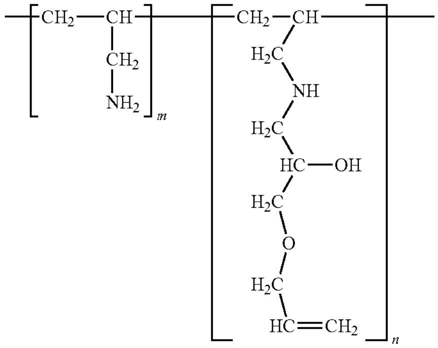
(P-7)
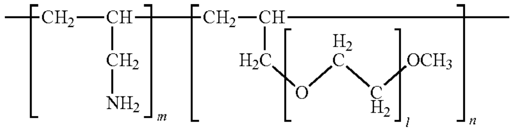
(P-8)
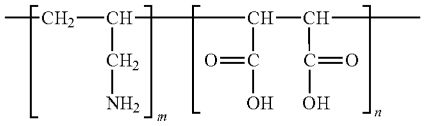
(P-9)
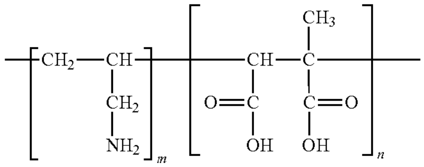
(P-10)
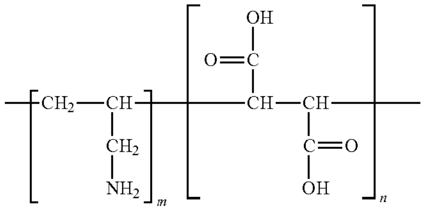
(P-11)
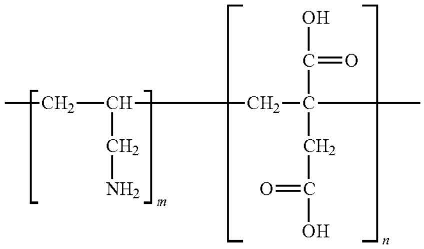
-continued
(P-12)
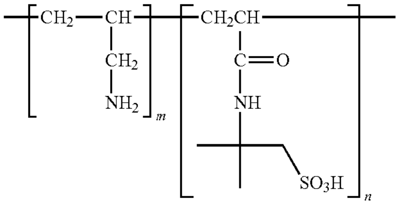
(P-13)
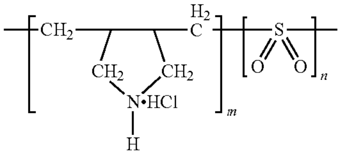
(P-14)
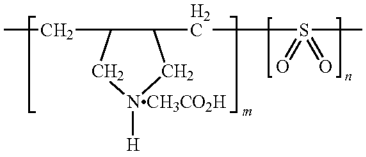
(P-15)
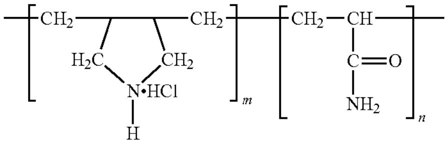
(P-16)
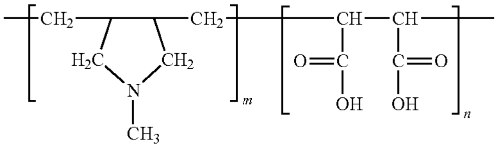
(P-17)
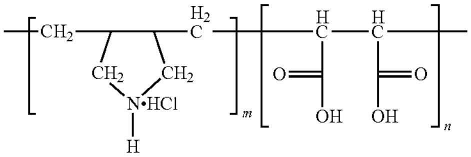
(P-18)
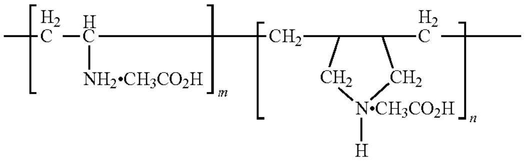
(P-19)
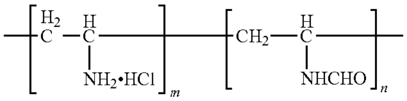
(P-20)
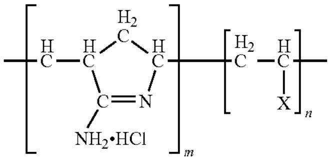

-continued (P-21)

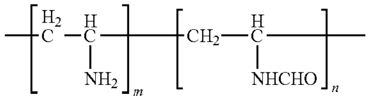

(P-22)

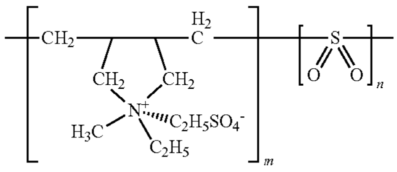

(P-23)

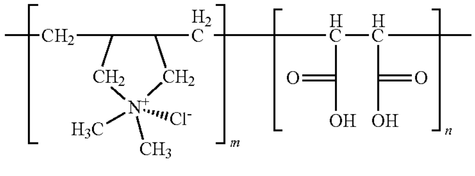

In Formulae (P-1) to (P-23), the ratio (m/n) of the number of moles m of the first repeating unit to the number of moles n of the second repeating unit is 1/20 to 20/1.

In Formula (P-7), 1 represents the number of repetitions of an oxyalkylene unit, which is an integer of 1 to 30.

In Formula (P-20), X represents an amide group, a nitrile group, an amino hydrochloride, or a formamide group.

Among the above, at least one skeleton structure selected from the group consisting of skeleton structures represented by Formulae (P-1) to (P-18) is preferable, at least one skeleton structure selected from the group consisting of skeleton structures represented by Formulae (P-8), (P-9), (P-10), and (P-11) is more preferable, and at least one skeleton structure selected from the group consisting of skeleton structures represented by Formulae (P-8), (P-10), and (P-11) is even more preferable.

The structure and the compositional ratio (the ratio in terms of mol %) of each repeating unit in the resin (B) can be measured by $^{13}$C-NMR.

The weight-average molecular weight of the resin (B) is not particularly limited, and is preferably 500 to 200,000, more preferably 1,000 to 100,000, even more preferably 2,000 to 50,000, and particularly preferably 5,000 to 50,000.

In the present specification, "weight-average molecular weight" means a polystyrene-equivalent weight-average molecular weight measured by gel permeation chromatography (GPC).

One resin (B) may be used alone, or two or more resins (B) thereof may be used in combination.

The content of the resin (B) with respect to the total mass of the composition is preferably 1 ppm by mass to 10% by mass, more preferably 10 to 10,000 ppm by mass, and even more preferably 50 to 1,000 ppm by mass.

<Chelating Agent>

The chelating agent has at least two nitrogen-containing groups.

Examples of the nitrogen-containing group include a primary amino group, a secondary amino group, an imidazolyl group, a triazolyl group, a benzotriazolyl group, a piperazinyl group, a pyrrolyl group, a pyrrolidinyl group, a pyrazolyl group, a piperidinyl group, a guanidinyl group, a biguanidinyl group, a carbazatyl group, a hydrazidyl group, a semicarbazidyl group, and an aminoguanidinyl group.

The chelating agent may have two or more nitrogen-containing groups, and the two or more nitrogen-containing groups may be different from each other, partially the same, or all the same.

In addition, the chelating agent may contain a carboxy group.

The nitrogen-containing group and/or the carboxy group contained in the chelating agent may be neutralized to form a salt.

The chelating agent may be a monocarboxylic acid compound that contains a primary amino group or a secondary amino group and at least one nitrogen-containing group.

The primary amino group and the secondary amino group are not directly bonded to the nitrogen-containing group that the chelating agent additionally contains, and are not a part of the nitrogen-containing group.

The nitrogen-containing group is, for example, $NH_2$, $H_2NC(=X)$, or $H_2NNHC(=X)$, where X represents O, S, or NR, and R represents a hydrogen atom or an alkyl group having 1 to 4 carbon atoms.

The aforementioned monocarboxylic acid is preferably a monocarboxylic acid compound that contains a primary amino group or a secondary amino group and at least one of the nitrogen-containing basic groups selected from the group consisting of an imidazolyl group, a triazolyl group, a benzotriazolyl group, a piperazinyl group, a pyrrolyl group, a pyrrolidinyl group, a pyrazolyl group, a piperidinyl group, a guanidinyl group, a carbazatyl group, a hydrazidyl group, a semicarbazidyl group, an aminoguanidinyl group, a primary amino group, and a secondary amino group.

The chelating agent may be a compound represented by Formula (C-1).

$$(R^{C3}NH)C(R^{C1})(R^{C2})CO_2H \quad (C\text{-}1)$$

$R^{C1}$ and $R^{C2}$ each independently represent a hydrogen atom, an alkyl group having 1 to 4 carbon atoms, or a group having a nitrogen-containing group. $R^{C3}$ represents a hydrogen atom, an alkyl group having 1 to 10 carbon atoms, or a group having a nitrogen-containing group. At least one of $R^{C1}$, $R^{C2}$, or $R^{C3}$ represents a group having a nitrogen-containing group.

Examples of the compound represented by Formula (C-1) include lysine, 2,3-diaminobutyric acid, 2,4-diaminobutyric acid, ornithine, 2,3-diaminopropionic acid, 2,6-diaminoheptanoic acid, 4-methyllysine, 3-methyllysine, 5-hydroxylysine, 3-methyl-L-arginine, arginine, homoarginine, Ns-monomethyl-L-arginine, $N^5$-[imino(methylamino)methyl]-D-ornithine, canavanine, histidine, N-(2-aminoethyl)glycine, N-(2-aminopropyl)glycine, $N^2$-methyllysine, $N^2$-methyl-L-arginine, $N^2$-(2-aminoethyl)-D-arginine, $N^2$-(2-aminoethyl)-L-arginine, 2-methyllysine, 2-methyl-L-arginine, 3,4-diaminobutyric acid, and 3-amino-5-[(aminoiminomethyl)methylamino]pentanoic acid.

The chelating agent may be a compound containing a biguanide group represented by Formula (C-2).

(C-2)

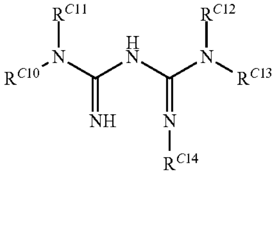

In Formula (C-2), $R^{C10}$, $R^{C11}$, $R^{C12}$, and $R^{C13}$ each independently represent a group selected from the group consisting of a hydrogen atom, a substituted or unsubstituted linear or branched alkyl group having 1 to 10 carbon atoms, a substituted or unsubstituted cyclic alkyl group having 3 to 10 carbon atoms, and a substituted or unsubstituted aryl group. $R^{C14}$ represents a hydrogen atom or is bonded to $R^{C13}$ to form an imidazole ring. Here, at least one of $R^{C10}$, $R^{C11}$, $R^{C12}$, or $R^{C13}$ is a substituted or unsubstituted aryl group, and at least two of $R^{C10}$, $R^{C11}$, $R^{C12}$, and $R^{C13}$ are hydrogen atoms.

Examples of the aryl group include a phenyl group, a naphthyl group, and an anthracenyl group. Examples of the substituent that the alkyl group and the aryl group may have include a halogen atom (for example, Cl, Br, or F), a nitro group, a thiol group, a dioxolyl group, a linear or branched alkyl group having 1 to 10 carbon atoms, a linear or branched alkoxy group having 1 to 10 carbon atoms, a cyclic alkyl group having 3 to 10 carbon atoms, a cyclic alkoxy group having 3 to 10 carbon atoms, and a substituted or unsubstituted phenyl group.

Examples of the compound containing a biguanide group having a substituted or unsubstituted aryl group include 1-phenylbiguanide, 1-(o-tolyl)biguanide, 1-(3-methylphenyl)biguanide, 1-(4-methylphenyl)biguanide, 1-(2-chlorophenyl)biguanide, 1-(4-chlorophenyl)biguanide, 1-(2,3-dimethylphenyl)biguanide, 1-(2,6-dimethylphenyl)biguanide, 1-(1-naphthyl)biguanide, 1-(4-methoxyphenyl)biguanide, 1-(4-nitrophenyl)biguanide, 1,1-diphenylbiguanide, 1,5-diphenylbiguanide, 1,5-bis(4-chlorophenyl)biguanide, 1,5-bis (3-chlorophenyl)biguanide, 1-(4-chloro)phenyl-5-(4-methoxy)phenylbiguanide, 1,1-bis(3-chloro-4-methoxyphenyl)biguanide, 1,5-bis(3,4-dichlorophenyl) biguanide, 1,5-bis(3,5-dichlorophenyl)biguanide, and 1,5-bis(4-bromophenyl)biguanide.

Examples of the compound containing a biguanide group having a substituted or unsubstituted aryl group and a substituted or unsubstituted linear or branched alkyl group having 1 to 10 carbon atoms include 1-phenyl-1-methyl biguanide, 1-(4-chlorophenyl)-5-(1-methylethyl)biguanide (proguanil), 1-(3,4-dichlorophenyl)-5-(1-methylethyl) biguanide, 1-(4-methylphenyl)-5-octylbiguanide, 1-(4-chlorophenyl)-2-(N'-propan-2-ylcarbamimidoyl)guanidine, ditolylbiguanide, dinaphthylbiguanide, and dibenzylbiguanide.

Examples of the compound containing a biguanide group having a substituted or unsubstituted linear or branched alkyl group having 1 to 10 carbon atoms include 4-chlorobenzhydrylbiguanide, 1-benzo[1,3]dioxol-5-ylmethyl-biguanide, 1-benzyl-5-(pyridin-3-yl)methylbiguanide, 1-benzylbiguanide, 4-chlorobenzylbiguanide, 1-(2-phenylethyl)biguanide, 1-hexyl-5-benzylbiguanide, 1,1-dibenzyl-biguanide, 1,5-dibenzylbiguanide, 1-(phenethyl)-5-propyl-biguanide, and 1,5-bis(phenethyl)biguanide.

Examples of compound containing a biguanide group having a substituted or unsubstituted cyclic alkyl group having 1 to 10 carbon atoms include 1-cyclohexyl-5-phenylbiguanide, 1-(4-phenylcyclohexyl)biguanide, 1-(4-methyl)cyclohexyl-5-phenylbiguanide, 1-cyclopentyl-5-(4-methoxyphenyl)biguanide, norbornyl biguanide, dinorbornyl biguanide, adamantyl biguanide, diadamantyl biguanide, and dicyclohexyl biguanide.

Examples of the compound represented by Formula (C-2) in which $R^{C14}$ and $R^{C13}$ are bonded to each other to form an imidazole ring include 2-guanidinobenzimidazole, 5-methyl-2-guanidinobenzimidazole, 4,6-dimethyl-2-guanidinobenzimidazole, 5,6-dimethyl-2-guanidinobenzimidazole, 5-chloro-2-guanidinobenzimidazole, 4,5-dichloro-2-guanidinobenzimidazole, 4,6-dichloro-2-guanidinobenzimidazole, 5-bromo-2-guanidinobenzimidazole, 5-phenyl-2-guanidinobenzimidazole, and 5-methoxy-2-guanidinobenzimidazole.

The chelating agent may be a compound containing two biguanide groups represented by Formula (C-3) (bisbiguanide compound).

(C-3)

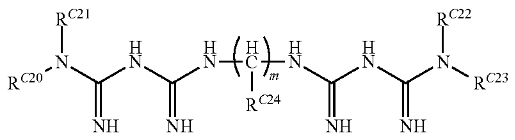

$R^{C20}$, $R^{C21}$, $R^{C22}$, and $R^{C23}$ each independently represent a group selected from the group consisting of a hydrogen atom, a substituted or unsubstituted linear or branched alkyl group having 1 to 10 carbon atoms, a substituted or unsubstituted cyclic alkyl group having 3 to 10 carbon atoms, and a substituted or unsubstituted aryl group. $R^{24}$ represents a group selected from the group consisting of a hydrogen atom, a substituted or unsubstituted aryl group, a substituted or unsubstituted phenylethyl group, and a substituted or unsubstituted benzylalkyl group. m represents an integer of 1 to 10. Here, at least one of $R^{C20}$, $R^{C21}$, $R^{C22}$, $R^{C23}$, or $R^{C24}$ is an aryl group or contains an aryl group as a substituent, and at least two of $R^{C20}$, $R^{C2}$, $R^{C22}$, and $R^{C23}$ are hydrogen atoms.

Examples of the bisbiguanide compound represented by Formula (C-3) include ethylene dibiguanide, propylene dibiguanide, tetramethylene dibiguanide, pentamethylene dibiguanide, hexamethylene dibiguanide, heptamethylene dibiguanide, octamethylene dibiguanide, 1,6-bis-(4-chlorobenzylbiguanide)-hexane (Fluorohexidine (registered trademark)), 1,1'-hexamethylene bis(5-p-chlorophenyl) biguanide)(chlorhexidine), 2-(benzyloxymethyl)pentane-1, 5-bis(5-hexylbiguanide), 2-(phenylthiomethyl)pentane-1,5-bis(5-phenethylbiguanide), 3-(phenylthio)hexane-1,6-bis(5-hexylbiguanide), 3-(phenylthio)hexane-1,6-bis(5-cyclohexylbiguanide), 3-(benzylthio)hexane-1,6-bis(5-hexylbiguanide), 3-(benzylthio)hexane-1,6-bis(5-cyclohexylbiguanide), and alexidine.

Examples of the compound containing two biguanide groups include phenylenyl dibiguanide, naphthylenyl dibiguanide, pyridinyl dibiguanide, piperazinyl dibiguanide, phthalyl dibiguanide, 1,1'-[4-(dodecyloxy)-m-phenylene] bisbiguanide, 2-(decylthiomethyl)pentane-1,5-bis(5-isopropylbiguanide), and 2-(decylthiomethyl)pentane-1,5-bis(5,5-diethylbiguanide).

The chelating agent may be a compound containing a repeating unit represented by Formula (C-4) (polymeric biguanide compound).

(C-4)

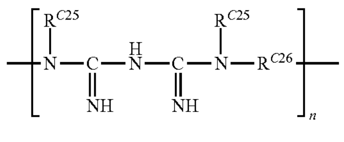

In Formula (C-4), n is an integer of 2 or more. $R^{C25}$'s each independently represent a hydrogen atom or an alkyl group having 1 to 6 carbon atoms. $R^{C26}$ is an alkylene group which may have a substituent having 1 to 20 carbon atoms.

"Alkylene group which may have a substituent" means that —$CH_2$— of the alkylene group may be substituted with a divalent substituent. Examples of the divalent substituent include —O—, —S—, —CO—, —COO—, —OCO—, —NH—, —CONH—, —SO—, —$SO_2$—, —$CHR^T$—, and —$C(R^T)_2$—. $R^T$ represents a monovalent substituent. Examples of the monovalent substituent include a hydroxy group, a nitro group, a thiol group, a halogen atom (for example, Cl, Br, or F), an amino group, a dioxolyl group, a biguanidyl group, a cyano group, a carboxy group, a linear or branched alkyl group having 1 to 10 carbon atoms, a linear or branched alkoxy group having 1 to 10 carbon atoms, a cyclic alkyl group having 3 to 10 carbon atoms, a cyclic alkoxy group having 3 to 10 carbon atoms, and a substituted or unsubstituted phenyl group.

Particularly, in a typical aspect, $R^{C25}$ is a hydrogen atom, $R^{C26}$ is a hexylene group, and n is 12 or 15.

The chelating agent may be a compound having a biguanide group side chain on a repeating unit. Examples of such a compound include a polymerization product of a biguanidyl-substituted α-olefin monomer and a copolymer thereof. Examples of the polymerization product of a biguanidyl-substituted α-olefin monomer include poly(vinylbiguanide), poly(N-vinylbiguanide), and poly(allylbiguanide).

The chelating agent may be an alkylene diamine such as ethylene diamine, propylene diamine, butylene diamine, hexylene diamine, diethylene triamine, triethylene tetramine, or polyethyleneimine having at least two nitrogen-containing groups.

The chelating agent may form a salt with an inorganic acid and/or an organic acid.

Examples of the inorganic acid salt include hydrochloric acid, hydrofluoric acid, hydrobromic acid, hydroiodic acid, phosphonic acid, phosphoric acid, sulfonic acid, and sulfuric acid.

Examples of the organic acid salt include formic acid, acetic acid, propionic acid, butyric acid, valeric acid, hexanoic acid, octanoic acid, 2-octenoic acid, lauric acid, 5-dodecenoic acid, myristic acid, pentadecanoic acid, palmitic acid, oleic acid, stearic acid, eicosanoic acid, heptadecanoic acid, palmitoleic acid, ricinoleic acid, 12-hydroxystearic acid, 16-hydroxyhexadecanoic acid, 2-hydroxycaproic acid, 12-hydroxydodecanoic acid, 5-hydroxydodecanoic acid, 5-hydroxydecanoic acid, 4-hydroxydecanoic acid, dodecanedioic acid, undecanedioic acid, sebacic acid, benzoic acid, hydroxybenzoic acid, and terephthalic acid.

One chelating agent may be used alone, or two or more chelating agents may be used in combination.

The content of the chelating agent with respect to the total mass of the composition is preferably 0.01% to 2% by mass, more preferably 0.1% to 1.5% by mass, and even more preferably 0.3% to 1.0% by mass.

<Other Metal Corrosion Inhibitors>

The metal corrosion inhibitor may be benzotriazole which may have a substituent. Here, benzotriazole contained in the chelating agent is excluded.

Examples of the benzotriazole which may have a substituent include benzotriazole (BTA), 5-aminotetrazole, 1-hydroxybenzotriazole, 5-phenylthiol-benzotriazole, 5-chlorobenzotriazole, 4-chlorobenzotriazole, 5-bromobenzotriazole, 4-bromobenzotriazole, 5-fluorobenzotriazole, 4-fluorobenzotriazole, naphthotriazole, tolyltriazole, 5-phenyl-benzotriazole, 5-nitrobenzotriazole, 4-nitrobenzotriazole, 3-amino-5-mercapto-1,2,4-triazole, 2-(5-amino-pentyl)-benzotriazole, 1-amino-benzotriazole, 5-methyl-1H-benzotriazole, benzotriazole-5-carboxylic acid, 4-methylbenzotriazole, 4-ethylbenzotriazole, 5-ethylbenzotriazole, 4-propylbenzotriazole, 5-propylbenzotriazole, 4-isopropylbenzotriazole, 5-isopropylbenzotriazole, 4-n-butylbenzotriazole, 5-n-butylbenzotriazole, 4-isobutylbenzotriazole, 5-isobutylbenzotriazole, 4-pentylbenzotriazole, 5-pentylbenzotriazole, 4-hexylbenzotriazole, 5-hexylbenzotriazole, 5-methoxybenzotriazole, 5-hydroxybenzotriazole, dihydroxypropylbenzotriazole, 1-[N,N-bis(2-ethylhexyl) aminomethyl]-benzotriazole, 5-t-butylbenzotriazole, 5-(1',1'-dimethylpropyl)-benzotriazole, 5-(1',1',3'-trimethylbutyl) benzotriazole, 5-n-octylbenzotriazole, and 5-(1',1',3',3'-tetramethylbutyl)benzotriazole.

(Metal Component)

The composition may contain a metal component.

Examples of the metal component include metal particles and metal ions. For example, the content of the metal component means the total content of metal particles and metal ions. The composition may contain either metal particles or metal ions, or may contain both of them.

Examples of the metal atom contained in the metal component include metal atoms selected from the group consisting of Ag, Al, As, Au, Ba, Ca, Cd, Co, Cr, Cu, Fe, Ga, Ge, K, Li, Mg, Mn, Mo, Na, Ni, Pb, Sn, Sr, Ti, Zn, and Zr.

The metal component may contain one metal atom or two or more metal atoms.

The metal particles may be a simple metal or an alloy, and may be in the form of particles in which a metal and an organic substance are aggregated.

The metal component may be a metal component which is inevitably incorporated into each component (raw material) of the composition or a metal component inevitably incorporated into the composition during the manufacturing, storage, and/or transfer of the composition. Alternatively, the metal component may be intentionally added.

In a case where the composition contains a metal component, the content of the metal component is often 0.01 ppt by mass to 10 ppm by mass with respect to the total mass of the composition. The content of the metal component is preferably 0.1 ppt by mass to 1 ppm by mass, and more preferably 0.1 ppt by mass to 100 ppb by mass.

The type and content of the metal component in the composition can be measured by inductively coupled plasma mass spectrometry (inductively coupled plasma mass spectrometry: ICP-MS).

With ICP-MS, the content of a metal component as a measurement target is measured regardless of the way the metal component is present. Accordingly, the total mass of metal particles and metal ions as a measurement target is quantified as the content of the metal component.

For the measurement by SP-ICP-MS, for example, it is possible to use Agilent 8800 triple quadrupole inductively coupled plasma mass spectrometry (ICP-MS, for semiconductor analysis, option #200) and Agilent 8900 manufactured by Agilent Technologies, Inc. and NexION 350S manufactured by PerkinElmer, Inc.

There is no particular limitation on the method of adjusting the content of each metal component in the composition. For example, by performing a known treatment of removing metals from the composition and/or from the raw material containing each component used for preparing the composition, it is possible to reduce the content of the metal component in the composition. Furthermore, by adding a compound containing metal ions to the composition, it is possible to increase the content of the metal component in the composition.

[pH]

The pH of the composition according to the embodiment of the present invention is not particularly limited and is, for example, in a range of 1.0 to 14.0.

From the viewpoint of further improving the effect of the present invention, the pH of the composition according to the embodiment of the present invention is preferably 2.0 to 11.0, more preferably 3.0 to 10.0, and even more preferably 4.0 to 8.0.

In the present specification, the pH of the composition is determined by measuring pH at 25° C. by using a pH meter (F-51 (trade name) manufactured by HORIBA, Ltd.).

[Manufacturing Method]

The manufacturing method of the composition according to the embodiment of the present invention is not particularly limited. For example, by mixing together the components described above, the composition can be manufactured. There is no particular limitation on the order or timing of mixing together the components. Examples of the manufacturing method include a method of sequentially adding a periodic acid compound, a specific quaternary ammonium salt, a trialkylamine or a salt thereof, and an optional component to a stirrer such as a mixer containing purified pure water, and thoroughly stirring the mixture to mix the components together and manufacture a composition.

Examples of the manufacturing method of the composition include a method of adjusting the pH of the washing solution in advance by using a pH adjuster and then mixing together components and a method of mixing together components and then adjusting the pH to a preset value by using a pH adjuster.

Furthermore, the composition according to the embodiment of the present invention may be manufactured by a method of manufacturing a concentrated solution having a lower content of a solvent, such as water, compared to the composition to be used, and diluting the solution with a diluent (preferably water) when the composition needs to be used such that the content of each component is adjusted to a predetermined content. The composition according to the embodiment of the present invention may also be manufactured by a method of diluting the concentrated solution with a diluent and then adjusting the pH thereof to a preset value by using a pH adjuster. For diluting the concentrated solution, a predetermined amount of diluent may be added to the concentrated solution or a predetermined amount of concentrated solution may be added to a diluent.

(Metal Removing Step)

In the above manufacturing method, a metal removing step of removing a metal component from the aforementioned component and/or the composition (hereinafter, also called "substance to be purified") may be performed. For example, an aspect may be adopted in which the metal removing step is performed on a substance to be purified containing the aforementioned periodic acid compound and water.

In the substance to be purified containing the aforementioned periodic acid compound and water, the content of the periodic acid compound is not particularly limited. The content of the periodic acid compound with respect to the total mass of the substance to be purified is preferably 0.0001% to 50% by mass, more preferably 1% to 45% by mass, and even more preferably 4% to 40% by mass. From the viewpoint of excellent treatment efficiency, the content of water in the substance to be purified is preferably 40% by mass or more and less than 100% by mass, more preferably 50% to 99% by mass, and more preferably 60% to 95% by mass.

The substance to be purified containing the periodic acid compound and water may further contain the component and/or optional component contained in the aforementioned composition.

Examples of the metal removing step include a step P of subjecting the substance to be purified to an ion exchange method.

<Step P>

In the step P, the substance to be purified described above is subjected to an ion exchange method.

The ion exchange method is not particularly limited as long as the amount of the metal component in the substance to be purified can be adjusted (reduced) by the method. From the viewpoint of more easily manufacturing the chemical liquid, it is preferable that the ion exchange method include one or more methods among the following methods P1 to P3. The ion exchange method more preferably includes two or more methods among the methods P1 to P3, and even more preferably includes all of the methods P1 to P3. In a case where the ion exchange method includes all of the methods P1 to P3, the methods may be performed in any order without particular limitation, but it is preferable to perform the methods P1 to P3 in this order.

Method P1: a method of passing the substance to be purified through a first filled portion filled with a mixed resin including a cation exchange resin and an anion exchange resin.

Method P2: a method of passing the substance to be purified through at least one filled portion among a second filled portion filled with a cation exchange resin, a third filled portion filled with an anion exchange resin, and a fourth filled portion filled with a chelating resin.

Method P3: a method of passing the substance to be purified through a membranous ion exchanger.

The procedure of the methods P1 to P3 will be specifically described later. In a case where the ion exchange resins (the cation exchange resin and the anion exchange resin), the chelating resin, and the membranous ion exchanger used in the methods are in forms other than $H^+$ or $OH^-$, it is preferable to use the resins and the ion exchanger after reproducing these in the form of $H^+$or $OH^-$.

The space velocity (SV) of the substance to be purified in each of the methods is preferably 0.01 to 20.0 (1/h), and more preferably 0.1 to 10.0 (1/h).

The treatment temperature in each of the methods is preferably 0° C. to 60° C., and more preferably 10° C. to 50° C.

The ion exchange resins and the chelating resin are in the form of, for example, particles, fibers, and porous monoliths. It is preferable that the ion exchange resins and the chelating resin be in the form of particles or fibers.

The average particle diameter of the ion exchange resins and the chelating resin in the form of particles is preferably 10 to 2,000 m, and more preferably 100 to 1,000 m.

Regarding the particle size distribution of the ion exchange resins and the chelating resin in the form of particles, it is preferable that the abundance ratio of resin particles having a size in a range of average particle diameter±200 μm be 90% or more.

The average particle diameter and the particle size distribution may be measured, for example, by a method using a particle size distribution analyzer (Microtrac HRA3920, manufactured by NIKKISO CO., LTD.) and using water as a dispersion medium.

—Method P1—

The method P1 is a method of passing the substance to be purified through a first filled portion filled with a mixed resin including a cation exchange resin and an anion exchange resin.

As the cation exchange resin, known cation exchange resins can be used. The cation exchange resin may be a gel type or a macroreticular (MR) type resin. Among these, the gel-type cation exchange resin is preferable.

Specific examples of the cation exchange resin include a sulfonic acid-type cation exchange resin and a carboxylic acid-type cation exchange resin.

Examples of the cation exchange resin include AMBERLITE IR-124, AMBERLITE IR-120B, AMBERLITE IR-200CT, ORLITE DS-1, and ORLITE DS-4 (manufactured by ORGANO CORPORATION), DUOLITE C20J, DUOLITE C20LF, DUOLITE C255LFH, and DUOLITE C-433LF (manufactured by Sumika Chemtex Co., Ltd.), C100, C150, and C100×16MBH (manufactured by Purolite), DIAION SK-110, DIAION SK1B, DIAION SK1BH, DIAION PK216, and DIAION PK228 (manufactured by Mitsubishi Chemical Corporation), and the like.

As the anion exchange resin, known anion exchange resins can be used. The anion exchange resin may be a gel type or an MR type. Among these, it is preferable to use the gel-type anion exchange resin.

Specific examples of the cation exchange resin include quaternary ammonium salt-type anion exchange resins.

Examples of the anion exchange resin include AMBERLITE IRA-400J, AMBERLITE IRA-410J, AMBERLITE IRA-900J, AMBERLITE IRA67, ORLITE DS-2, ORLITE DS-5, and ORLITE DS-6 (manufactured by ORGANO CORPORATION), DUOLITE A113LF, DUOLITE A116, and DUOLITE A-375LF (manufactured by Sumika Chemtex Co., Ltd.), A400 and A500 (manufactured by Purolite), DIAION SA12A, DIAION SA10AO, DIAION SA10AOH, DIAION SA20A, and DIAION WA10 (manufactured by Mitsubishi Chemical Corporation), and the like.

Examples of commercially available products marketed in the form of a premix of a strongly acidic cation exchange resin and a strongly alkaline anion exchange resin include DUOLITE MB5113, DUOLITE UP6000, and DUOLITE UP7000 (manufactured by Sumika Chemtex Co., Ltd.), AMBERLITE EG-4A-HG, AMBERLITE MB-1, AMBERLITE MB-2, AMBERJET ESP-2, AMBERJET ESP-1, ORLITE DS-3, ORLITE DS-7, and ORLITE DS-10 (manufactured by ORGANO CORPORATION), DIAION SMNUP, DIAION SMNUPB, DIAION SMT100L, and DIAION SMT200L (all manufactured by Mitsubishi Chemical Corporation), and the like.

In a case where a mixed resin including a cation exchange resin and an anion exchange resin is prepared, the mixing ratio of the resins represented by a volume ratio of cation exchange resin/anion exchange resin is preferably 1/4 to 4/1, and more preferably 1/3 to 3/1.

As a combination of the cation exchange resin and the anion exchange resin, for example, a combination of a gel-type sulfonic acid cation exchange resin and a gel-type quaternary ammonium salt anion exchange resin is suitable.

Generally, the first filled portion includes a container and the aforementioned mixed resin including a cation exchange resin and an anion exchange resin that fills up the container.

Examples of the container include a column, a cartridge, a filled column, and the like. However, containers other than those exemplified above may also be used, as long as the substance to be purified can pass through the containers filled with the mixed resin.

In the method P1, the substance to be purified may be passed through at least one first filled portion. Particularly, in view of more easily manufacturing the chemical liquid, the substance to be purified may be passed through two or more first filled portions.

—Method P2—

The method P2 is a method of passing the substance to be purified through at least one filled portion (preferably two or more filled portions) among a second filled portion filled with a cation exchange resin, a third filled portion filled with an anion exchange resin, and a fourth filled portion filled with a chelating resin.

Examples of the cation exchange resin and the anion exchange resin that can be used in the method P2 include the cation exchange resins and the anion exchange resins exemplified in the description of the method P1.

Generally, the second filled portion includes a container and the aforementioned cation exchange resin that fills up the container.

Generally, the third filled portion includes a container and the aforementioned anion exchange resin that fills up the container.

Generally, the fourth filled portion includes a container and a chelating resin filling up the container that will be described below.

The chelating resin generally refers to a resin having a coordinating group capable of forming a chelate bond with a metal ion.

For example, the chelating resin is a resin obtained by introducing a chelate forming group into a styrene-divinylbenzene copolymer or the like. The material of the chelating resin may be a gel type or an MR type. From the viewpoint of treatment efficiency, the chelating resin is preferably in the form of particles or fibers.

Examples of the chelating resin include various chelating resins including an aminophosphonic acid type such as an iminodiacetic acid type, an iminopropionic acid type, and an aminomethylphosphonic acid type, a glucamine type such as a polyamine type and a N-methylglucamine type, an aminocarboxylic acid type, a dithiocarbamic acid type, a thiol type, an amidoxime type, and a pyridine type.

Specific examples thereof include an iminodiacetate type chelating resin such as MC700 manufactured by Sumika Chemtex Co., Ltd., an iminopropionic acid type chelating resin such as EPOLAS MX-8 manufactured by MIYOSHI OIL & FAT CO., LTD., an aminomethylphosphonic acid-type chelating resin such as MC960 manufactured by Sumika Chemtex Co., Ltd., a polyamine-type chelating resin such as S985 manufactured by Purolite and DIAION CR-20 manufactured by Mitsubishi Chemical Corporation., and a N-methylglucamine type chelating resin such as AMBERLITE IRA-743 manufactured by ORGANO CORPORATION.

The definitions of the containers in the second filled portion, the third filled portion, and the fourth filled portion are as described above.

In the method P2, the substance to be purified is passed through at least one filled portion among the second filled portion, the third filled portion, and the fourth filled portion. It is particularly preferable that the substance to be purified be passed through two or more filled portions among the second filled portion, the third filled portion, and the fourth filled portion.

In the method P2, it is preferable that the substance to be purified be passed through at least the second filled portion.

Furthermore, in the method P2, in a case where the substance to be purified is passed through the fourth filled portion, even though the number of times that the substance to be purified is passed through the filled portions is small, the substance can be efficiently purified.

In a case where the substance to be purified is passed through two or more filled portions in the method P2, the substance to be purified may be passed through two or more filled portions in any order among the second filled portion, the third filled portion, and the fourth filled portion.

In the method P2, the substance to be purified may be passed through at least one second filled portion (preferably two or more second filled portions), at least one third filled portion (preferably two or more third filled portions), and/or at least one fourth filled portion.

For example, in view of more easily manufacturing the chemical liquid, the substance to be purified may be passed through one or more (preferably two or more) second filled portions and one or more (preferably two or more) third filled portions.

In this case, there is no limitation on the order in which the substance to be purified is passed through the filled portions. For example, the substance to be purified may be alternately passed through the second filled portion and the third filled portion. Alternatively, the substance to be purified may be continuously passed through one of a plurality of second filled portions and a plurality of third filled portions, and then continuously passed through the other ones among the plurality of second filled portions or the plurality of third filled portions.

In addition, in view of more easily manufacturing the chemical liquid, the substance to be purified may be passed through one or more second filled portions and one or more fourth filled portions.

Even in this case, there is no limitation on the order in which the substance to be purified is passed through the filled portions.

—Method P3—

The method P3 is a method of passing the substance to be purified through a membranous ion exchanger.

The membranous ion exchanger is a membrane having an ion exchange group. Examples of the ion exchange group include a cation exchange group (such as a sulfonic acid group) and an anion exchange group (such as an ammonium group).

The membranous ion exchanger may be composed of an ion exchange resin, or may be composed of a membranous support and a cation exchange group and/or an anion exchange group introduced into the support. The membranous ion exchanger (including the support of the membranous ion exchanger) may be porous or nonporous. The membranous ion exchanger (including the support of the membranous ion exchanger) may be obtained by forming an aggregate of particles and/or fibers into a membrane.

Furthermore, for example, the membranous ion exchanger may be any of an ion exchange membrane, ion exchange nonwoven fabric, ion exchange filter paper, and ion exchange filter cloth.

The membranous ion exchanger may be used, for example, in a manner in which the membranous ion exchanger is incorporated into a cartridge as a filter and an aqueous solution is passed through the filter.

It is preferable to use a semiconductor-grade membranous ion exchanger.

Examples of commercially available products of the membranous ion exchanger include MUSTANG (manufactured by Pall Corporation) and a PROTEGO (registered trademark) Plus LT Purifier (manufactured by Entegris).

The thickness of the membranous ion exchanger is not particularly limited, and is preferably, for example, 0.01 to 1 mm.

The flow rate of the aqueous solution is, for example, 1 to 100 $mL/(min \cdot cm^2)$.

In the method P3, the substance to be purified may be passed through at least one membranous ion exchanger. Particularly, in view of more easily manufacturing the chemical liquid, the substance to be purified may be passed through two or more membranous ion exchangers.

In a case where two or more membranous ion exchangers are used, at least one membranous ion exchanger having a cation exchange group and at least one ion exchanger having an anion exchange group may be used.

The ion exchange method is preferably carried out until the content of the metal component contained in the substance to be purified falls into the aforementioned preferred range of the metal component content.

(Filtration Step)

It is preferable that the manufacturing method include a filtration step of filtering a liquid such that foreign substances, coarse particles, and the like are removed from the liquid.

The filtration method is not particularly limited, and known filtration methods can be used. Among these, filtering using a filter is preferable.

The filter to be used for filtering can be used without particular limitation, as long as the filter has been used in the related art for filtration or the like. Examples of the material constituting the filter include a fluororesin such as polytetrafluoroethylene (PTFE), a polyamide-based resin such as nylon, a polyolefin-based resin (including a high-density and ultrahigh-molecular-weight polyolefin-based resin) such as polyethylene or polypropylene (PP), polyarylsulfone, and the like. Among these, a polyamide-based resin, PTFE, polypropylene (including high-density polypropylene), and polyarylsulfone are preferable.

Using a filter formed of these materials makes it possible to more effectively remove foreign substances having high polarity which are likely to cause defects from the composition.

The lower limit of the critical surface tension of the filter is preferably 70 mN/m or more, and the upper limit thereof is preferably 95 mN/m or less. Particularly, the critical surface tension of the filter is preferably 75 to 85 mN/m.

Note that the value of the critical surface tension is a nominal value from the manufacturer. Using a filter having a critical surface tension in the above range makes it possible to more effectively remove foreign substances having high polarity which are likely to cause defects from the composition.

The pore diameter of the filter is preferably about 0.001 to 1.0 m, more preferably about 0.02 to 0.5 m, and even more preferably about 0.01 to 0.1 m. In a case where the pore diameter of the filter is in the above range, it is possible to reliably remove fine foreign substances contained in the composition while suppressing filter clogging.

At the time of using the filter, different filters may be combined. At this time, filtering carried out using a first filter may be performed once or performed two or more times. In a case where different filters are combined and used for performing filtering twice or more, the filters may be the same type of filters or different types of filters. It is preferable that the filters be different types of filters. Typically, it is preferable that at least one of the pore diameter or the constituent material vary between the first filter and the second filter.

It is preferable that the pore diameters for the second filtering and the subsequent filtering be equal to or smaller than the pore diameter for the first filtering. Furthermore, first filters having different pore diameters within the above range may be combined. As the pore diameter mentioned herein, the nominal values form filter manufacturers can be referred to. A commercial filter can be selected from various filters provided from, for example, Pall Corporation Japan, Advantec Toyo Kaisha, Ltd., Nihon Entegris KK (former MICRONICS JAPAN CO., LTD.), KITZ MICRO FILTER CORPORATION, or the like. In addition, it is possible to use "P-NYLON FILTER (pore diameter: 0.02 μm, critical surface tension: 77 mN/m)" made of polyamide; (manufactured by Pall Corporation Japan), "PE×CLEAN FILTER (pore diameter: 0.02 μm)" made of high-density polyethylene; (manufactured by Pall Corporation Japan), and "PE× CLEAN FILTER (pore diameter: 0.01 μm)" made of high-density polyethylene; (manufactured by Pall Corporation Japan).

As a second filter, a filter formed of the same material as the first filter can be used. A filter having the same pore diameter as that of the first filter can be used. In a case where the pore diameter of the second filter is smaller than the pore diameter of the first filter, the ratio of the pore diameter of the second filter to the pore diameter of the first filter (pore diameter of second filter/pore diameter of first filter) is preferably 0.01 to 0.99, more preferably 0.1 to 0.9, and even more preferably 0.3 to 0.9. In a case where the pore diameter of the second filter is within the above range, fine foreign substances mixed into the composition are more reliably removed.

For example, the filtering with the first filter may be performed on a mixed solution containing some of the components of the composition, the rest of the components may be mixed with the mixed solution to prepare the composition, and then the second filtering may be performed.

It is preferable that the filter to be used be treated before the composition is filtered. The liquid that is used for this treatment is not particularly limited, and is preferably the composition and a liquid containing components that are contained in the composition.

In a case where filtering is performed, the upper limit of the temperature during the filtering is preferably equal to or lower than room temperature (25° C.), more preferably 23° C. or lower, and even more preferably 20° C. or lower. The lower limit of the temperature during the filtering is preferably 0° C. or higher, more preferably 5° C. or higher, and even more preferably 10° C. or higher.

By the filtering, particle-like foreign substances and/or impurities can be removed. In a case where the filtering is carried out at the above temperature, the amount of particle-like foreign substances and/or impurities dissolved in the composition is reduced, and thus the filtering is more efficiently performed.

[Container]

The container that accommodates the aforementioned composition is not particularly limited as long as the container has no problem of corrosion caused by a liquid. Known containers can be used as the container.

As the container, it is preferable to use a container for semiconductors which has a high internal cleanliness and is unlikely to cause elution of impurities.

Examples of commercially available products of the container include a "CLEAN BOTTLE" series manufactured by AICELLO CORPORATION, and "PURE BOTTLE" manufactured by KODAMA PLASTICS Co., Ltd. In addition, for the purpose of preventing the mixing of impurities into the raw materials and the chemical liquid (contamination), it is also preferable to use a multi-layer container with interior wall having a six-layer structure consisting of six types of resins and a multi-layer container with interior wall having a seven-layer structure consisting of six types of resins. Examples of these containers include the containers described in JP2015-123351A, but the present invention is not limited thereto.

The interior wall of the container is preferably formed of or coated with one or more resins selected from the group consisting of a polyethylene resin, a polypropylene resin, and a polyethylene-polypropylene resin, a resin different from these, and a metal such as stainless steel, HASTELLOY, INCONEL, or MONEL.

As "resin different from these" described above, a fluororesin (perfluororesin) can be preferably used. In a case where a container that has interior wall formed of or coated with a fluororesin is used, it possible to further suppress the occurrence of a problem of elution of an ethylene or propylene oligomer, than in a case where a container that has interior wall formed of or coated with a polyethylene resin, a polypropylene resin, or a polyethylene-polypropylene resin is used.

Specific examples of the container having such an interior wall include a FluoroPure PFA composite drum manufactured by Entegris, and the like. In addition, it is also possible to use the containers described on page 4 of JP1991-502677A (JP-H03-502677A), page 3 of WO2004/016526A, and pages 9 and 16 of the WO99/46309A.

It is preferable that the inside of these containers be washed before the containers are filled. The liquid to be used for washing may be appropriately selected according to the use, and is preferably the aforementioned composition, a liquid obtained by diluting the composition, or a liquid containing at least one of the components added to the composition.

In order to prevent changes in the components of the composition during storage, the inside of the container may be purged with an inert gas (such as nitrogen or argon) having a purity of 99.99995% by volume or higher. Particularly, a gas with a low moisture content is preferable. The liquid container may be transported or stored at normal temperature. In order to prevent deterioration, the liquid container may be transported or stored at a temperature controlled within a range of −20° C. to 20° C.

Object to be Treated

The composition according to the embodiment of the present invention is preferably used for removing a Ru-containing substance on a substrate.

In the present specification, "on a substrate" includes, for example, all of the front and back, the lateral surfaces, the inside of grooves of a substrate, and the like. The Ru-containing substance on a substrate includes not only a Ru-containing substance which is directly on the surface of the substrate but also a Ru-containing substance which is on the substrate via another layer.

Hereinafter, recesses such as grooves and holes provided on the substrate will be also called "a groove or the like".

The type of substrate is not particularly limited, and is preferably a semiconductor substrate.

Examples of the substrate include a semiconductor wafer, a glass substrate for a photomask, a glass substrate for liquid crystal display, a glass substrate for plasma display, a substrate for field emission display (FED), a substrate for an optical disk, a substrate for a magnetic disk, and a substrate for a magneto-optical disk.

Examples of materials constituting the semiconductor substrate include silicon, germanium, silicon germanium, a Group III-V compound such as GaAs, and a combination of these.

The use of the object to be treated having been treated with the composition according to the embodiment of the present invention is not particularly limited. For example, such an object to be treated may be used for dynamic random access memory (DRAM), ferroelectric random access memory (FRAM (registered trademark)), magnetoresistive random access memory (MRAM), and phase change random access memory (PRAM), or may be used for a logic circuit, a processor, and the like.

The Ru-containing substance is not particularly limited as long as it is a substance containing Ru (a Ru atom). Examples of the Ru-containing substance include simple Ru, an Ru-containing alloy, a Ru oxide, a Ru nitride, and a Ru oxynitride.

The Ru oxide, the Ru nitride, and the Ru oxynitride may be a composite oxide, a composite nitride, or a composite oxynitride containing Ru.

The content of Ru atoms in the Ru-containing substance with respect to the total mass of the Ru-containing substance is preferably 10% by mass or more, more preferably 30% by mass or more, even more preferably 50% by mass or more, and particularly preferably 90% by mass or more. The upper limit thereof is not particularly limited, and is preferably 100% by mass or less with respect to the total mass of the Ru-containing substance.

The Ru-containing substance may contain other transition metals.

Examples of the transition metals include Rh (rhodium), Ti (titanium), Ta (tantalum), Co (cobalt), Cr (chromium), Hf (hafnium), Os (osmium), and Pt (platinum), Ni (nickel), Mn (manganese), Cu (copper), Zr (zirconium), Mo (molybdenum), La (lanthanum), W (tungsten), and Ir (iridium).

The form of the Ru-containing substance on the substrate is not particularly limited. For example, the Ru-containing substance may be disposed in the form of a film, a wiring line, a plate, a column, and particles.

Examples of the substrate, on which the Ru-containing substance is disposed in the form of particles, include a substrate obtained by performing dry etching on a substrate on which a Ru-containing film is disposed such that particle-like Ru-containing substances are then attached to the substrate as residues as will be described later, a substrate obtained by performing a chemical mechanical polishing (CMP) treatment on the Ru-containing film such that particle-like Ru-containing substances are then attached to the substrate as residues as will be described later, and a substrate obtained by depositing a Ru-containing film on a substrate such that a particle-like Ru-containing substance is then attached to a region other than a region where a Ru-containing film is supposed to be formed.

The thickness of the Ru-containing film is not particularly limited and may be appropriately selected depending on the use. For example, the thickness of the Ru-containing film is preferably 200 nm or less, more preferably 100 nm or less, and even more preferably 50 nm or less. The lower limit thereof is not particularly limited, and is preferably 0.1 nm or more.

The Ru-containing film may be disposed only on one of the main surfaces of the substrate, or may be disposed on both the main surfaces of the substrate. Furthermore, the Ru-containing film may be disposed on the entire main surface of the substrate, or may be disposed on a portion of the main surface of the substrate.

The object to be treated may include various layers or structures as desired in addition to the Ru-containing substance. For example, one or more members selected from the group consisting of a metal wire, a gate electrode, a source electrode, a drain electrode, an insulating film, a ferromagnetic layer, and a non-magnetic layer may be disposed on the substrate.

The substrate may include an exposed integrated circuit structure. Examples of the integrated circuit structure include an interconnection mechanism such as a metal wire and a dielectric material. Examples of metals and alloys used for the interconnection mechanism include aluminum, a copper-aluminum alloy, copper, titanium, tantalum, cobalt, silicon, titanium nitride, tantalum nitride, tungsten, and molybdenum. The substrate may include a layer of one or more materials selected from the group consisting of silicon oxide, silicon nitride, silicon carbide, and carbon-doped silicon oxide.

The size, thickness, shape, layer structure, and the like of the substrate are not particularly limited, and can be appropriately selected as desired.

[Manufacturing Method of Object to be Treated]

The manufacturing method of the object to be treated is not particularly limited, and known manufacturing methods can be used.

For example, by using a sputtering method, a chemical vapor deposition (CVD) method, a molecular beam epitaxy (MBE) method, or an atomic layer deposition (ALD) as the manufacturing method of the object to be treated, it is possible to form a Ru-containing film on a substrate.

In forming a Ru-containing film by using the above manufacturing method, in a case where the substrate has a structure with irregularities, sometimes the Ru-containing film is formed on all surfaces of the structure.

Especially, in a case where the Ru-containing film is formed by a sputtering method, a CVD method, or the like, sometimes the Ru-containing film is also attached to the back surface of the substrate on which the Ru-containing film is disposed (the surface opposite to the side of the Ru-containing film).

Furthermore, a Ru-containing wiring line may be formed on a substrate by performing the aforementioned method via a predetermined mask.

In addition, a substrate on which a Ru-containing film or a Ru-containing wiring line is disposed may be subjected to a predetermined treatment and used as an object to be treated by the treatment method according to the embodiment of the present invention.

For example, by performing dry etching on a substrate on which a Ru-containing film or a Ru-containing wiring line is disposed, a substrate having dry etching residues containing Ru may be manufactured. Furthermore, by performing CMP on a substrate on which a Ru-containing film or a Ru-containing wiring line is disposed, a substrate having a Ru-containing substance may be manufactured. Furthermore, by a sputtering method, a CVD method, a molecular beam epitaxy method, or an atomic layer deposition method, a Ru-containing film may be deposited on the region where a Ru-containing film is supposed to be formed on the substrate, such that a substrate having a Ru-containing substance attached to a region other than the region where a Ru-containing film is supposed to be formed is manufactured.

Method for Treating Substrate

[Step A]

The method for treating a substrate according to an embodiment of the present invention (hereinafter, also called "present treatment method") includes a step A of removing a Ru-containing substance on a substrate by using the composition according to an embodiment of the present invention.

In addition, the substrate with a Ru-containing substance that is disposed on the substrate, which is an object to be treated by the present treatment method, is as described above.

Examples of the specific method of the step A include a method of bringing the substrate as an object to be treated, on which a Ru-containing substance is disposed, into contact with the composition.

The method of bringing the substrate into contact with the composition is not particularly limited, and examples thereof include a method of immersing the object to be treated in the composition put in a tank, a method of spraying the composition onto the object to be treated, a method of causing the composition to flow on the object to be treated, and a combination of these. Among these, the method of immersing the object to be treated in the composition is preferable.

In order to further enhance the washing ability of the composition, a mechanical stirring method may also be used.

Examples of the mechanical stirring method include a method of circulating the composition on an object to be treated, a method of irrigating an object to be treated with the composition or spraying the composition onto an object to be treated, and a method of locally stirring the composition in the vicinity of a substrate by irradiation with ultrasonic waves (for example, megasonic).

The treatment time of the step A can be appropriately adjusted. The treatment time (the contact time between the composition and the object to be treated) is not particularly limited, and is preferably 0.25 to 10 minutes, and more preferably 0.5 to 2 minutes.

The temperature of the composition during the treatment is not particularly limited, and is preferably 20° C. to 75° C., more preferably 20° C. to 60° C., even more preferably 40° C. to 65° C., and particularly preferably 50° C. to 65° C.

In the step A, a treatment may be performed in which one or more component selected from the group consisting of a solvent and components of the composition are added to the composition as necessary in a state where the concentration of one or more components selected from the group consisting of the periodic acid compound, the specific quaternary ammonium salt, the trialkylamine or a salt thereof, and optional components in the composition is being measured. In a case where this treatment is performed, the concentration of components in the composition can be stably maintained in a predetermined range. As the solvent, water is preferable.

Specific examples of suitable aspects of the step A include a step A1 of performing a recess etching treatment on a Ru-containing wiring line or Ru-containing liner disposed on a substrate by using the composition, a step A2 of removing a Ru-containing film at an outer edge portion of a substrate, on which the Ru-containing film is disposed, by using the composition, a step A3 of removing a Ru-containing substance attached to a back surface of a substrate, on which a Ru-containing film is disposed, by using the composition, a step A4 of removing a Ru-containing substance on a substrate, which has undergone dry etching, by using the composition, a step A5 of removing a Ru-containing substance on a substrate, which has undergone a chemical mechanical polishing treatment, by using the composition, or a step A6 of removing a ruthenium-containing substance in a region other than a region where a ruthenium-containing film is supposed to be formed on a substrate by using the composition after a ruthenium-containing film is deposited on the region where a ruthenium-containing film is supposed to be formed on the substrate.

Hereinafter, the present treatment method used in each of the above treatments will be described.

(Step A1)

Examples of the step A include a step A1 of performing recess etching treatment on a Ru-containing wiring line (wiring line containing Ru) and a Ru-containing liner (liner containing Ru) disposed on a substrate by using the composition.

Hereinafter, as an example of the object to be treated in the step A1, a substrate having a Ru-containing wiring line, and a substrate having a Ru-containing liner will be specifically described.

<Substrate Having Ru-Containing Wiring Line>

FIG. 1 is a schematic cross-sectional top view showing a substrate having a Ru-containing wiring line (hereinafter, also called "Ru wiring board") which is an example of object to be treated by the recess etching treatment in the step A1.

A Ru wiring board 10*a* shown in FIG. 1 has a substrate not shown in the drawing, an insulating film 12 having a groove or the like disposed on the substrate, a barrier metal layer 14 disposed along the interior wall of the grooves and the like, and a Ru-containing wiring line 16 that fills up the inside of the grooves and the like.

It is preferable that the Ru-containing wiring line in the Ru wiring board contain simple Ru, an alloy of Ru, an oxide of Ru, a nitride of Ru, or an oxynitride of Ru.

The material constituting the barrier metal layer in the Ru wiring board is not particularly limited, and examples thereof include a Ti metal, a Ti nitride, a Ti oxide, a Ti—Si alloy, a Ti—Si composite nitride, a Ti—Al alloy, a Ta metal, a Ta nitride, and a Ta oxide.

In FIG. 1, an aspect is illustrated in which the Ru wiring board has a barrier metal layer. However, the Ru wiring board may not have the barrier metal layer.

In the step A1, by performing a recess etching treatment on the Ru wiring board in the wiring board by using the aforementioned composition, a portion of the Ru-containing wiring line can be removed, and a recess can be formed.

Figure 2:
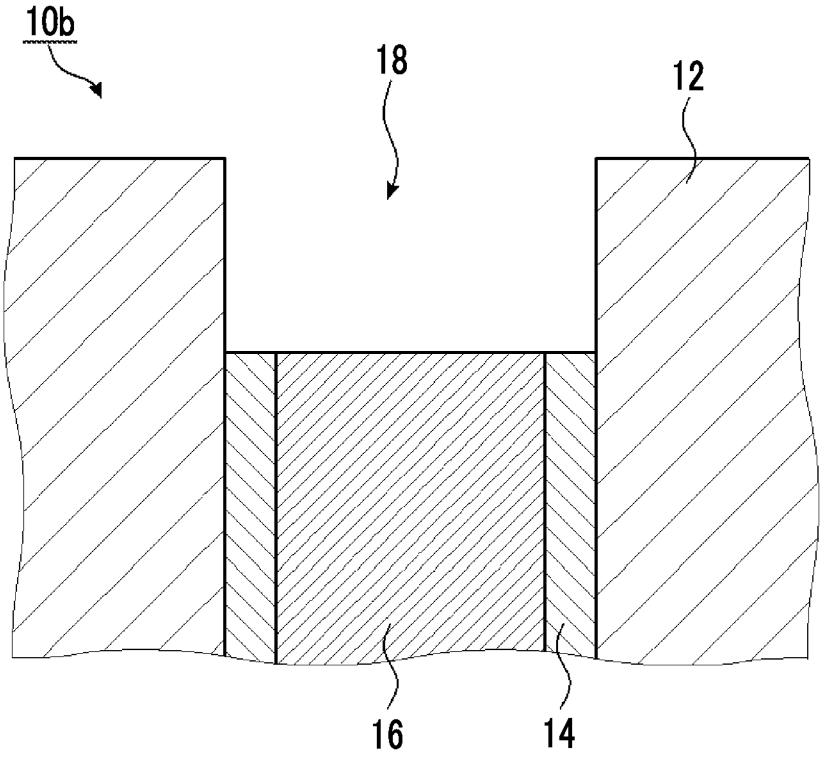
FIG. 2 is a schematic cross-sectional top view showing an example illustrating the object to be treated shown in FIG. 1 that has undergone the step A1.

More specifically, in a case where the step A1 is performed, as shown in a Ru wiring board 10*b* in FIG. 2, a portion of the barrier metal layer 14 and the Ru-containing wiring line 16 is removed, and a recess 18 is formed.

In the aspect shown in FIG. 2, the barrier metal layer 14 and the Ru-containing wiring line 16 are partially removed from the Ru wiring board 10*b*. However, the barrier metal layer 14 may not be removed, and only a part of the Ru-containing wiring line 16 may be removed to form the recess 18.

The manufacturing method of the Ru wiring board is not particularly limited, and examples thereof include a method having a step of forming an insulating film on a substrate, a step of forming a groove or the like in the insulating film, a step of forming a barrier metal layer on the insulating film, a step of forming a Ru-containing film that fills up the grooves and the like, and a step of performing a smoothing treatment on the Ru-containing film.

<Substrate Having Ru-Containing Liner>

Figure 3:
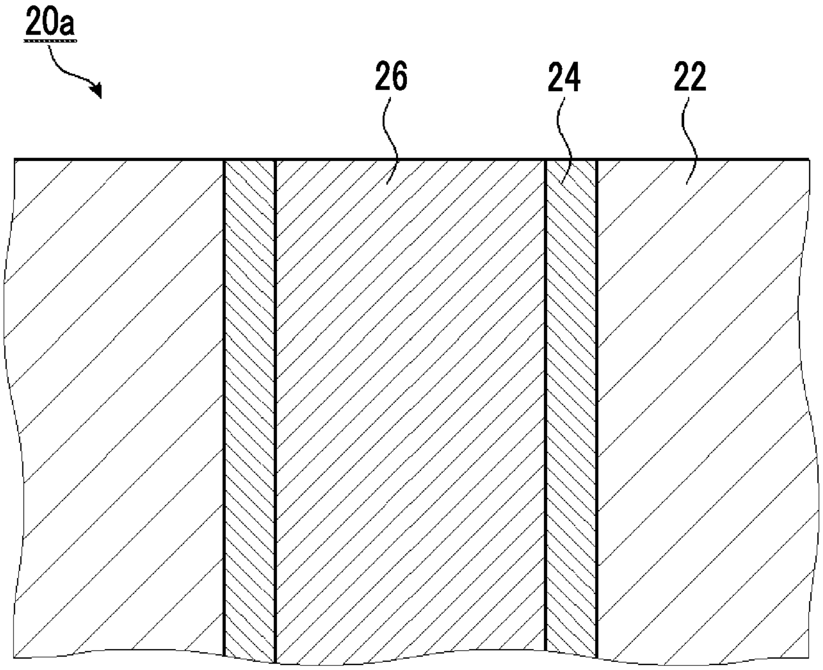
FIG. 3 is a schematic cross-sectional top view showing another example of the object to be treated used in the step A1.

FIG. 3 is a schematic cross-sectional top view showing a substrate having a Ru-containing liner (hereinafter, also called "Ru liner substrate") which is an example of an object to be treated by the recess etching treatment in the step A1.

A Ru liner substrate 20*a* shown in FIG. 3 has a substrate not shown in the drawing, an insulating film 22 having a groove or the like disposed on the substrate, a Ru-containing liner 24 disposed along the interior wall of the grooves and the like, and a wiring part 26 that fills up the inside of the grooves and the like.

It is preferable that the Ru-containing liner in the Ru liner substrate contain simple Ru, an alloy of Ru, an oxide of Ru, a nitride of Ru, or an oxynitride of Ru.

In the Ru liner substrate shown in FIG. 3, a barrier metal layer may be additionally provided between the Ru-containing liner 24 and the insulating film 22. Examples of the material constituting the barrier metal layer are the same as the material of the barrier metal layer in the Ru wiring board.

The material constituting the wiring part in the Ru liner substrate is not particularly limited, and examples thereof include a Cu metal, a W metal, a Mo metal, and a Co metal.

In the step A1, by performing a recess etching treatment on the Ru liner substrate by using the aforementioned composition, a portion of the Ru-containing liner can be removed, and a recess can be formed.

Figure 4:
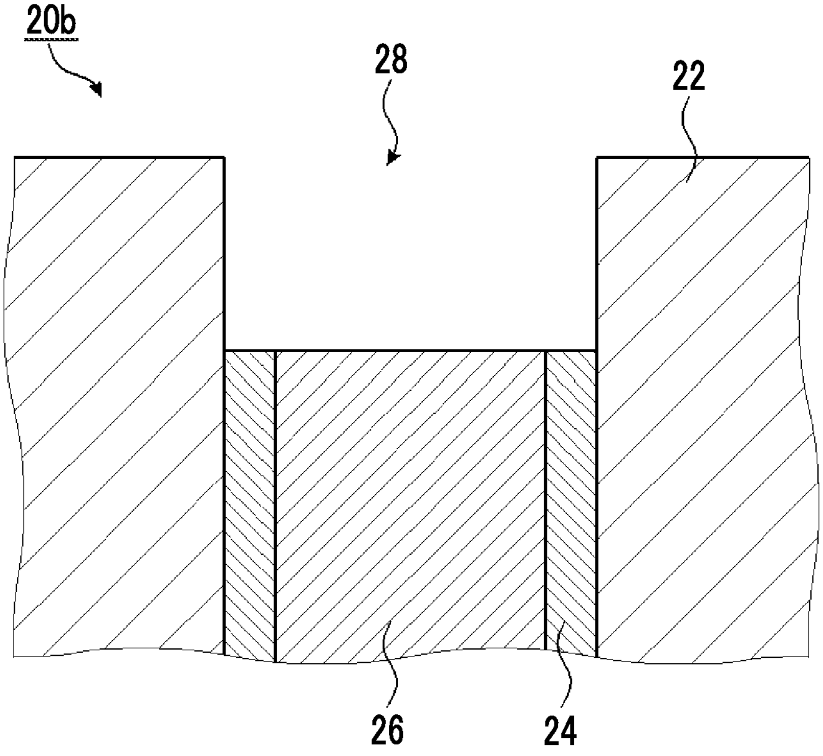
FIG. 4 is a schematic cross-sectional top view showing an example illustrating the object to be treated shown in FIG. 3 that has undergone the step A1.

More specifically, in a case where the step A1 is carried out, as shown in a Ru liner substrate 20*b* in FIG. 4, the Ru-containing liner 24 and the wiring part 26 are partially removed to form a recess 28.

The manufacturing method of the Ru liner substrate is not particularly limited, and examples thereof include a method having a step of forming an insulating film on a substrate, a step of forming a groove or the like in the insulating film, a step of forming a Ru liner on the insulating film, a step of forming a metal film that fills up the groove or the like, and a step of performing a smoothing treatment on the metal film.

Examples of specific methods of the step A1 include a method of bringing the Ru wiring board or the Ru liner substrate into contact with the composition.

The method of bringing the Ru wiring board or the Ru liner substrate into contact with the composition is as described above.

The suitable ranges of the contact time between the Ru wiring board or the Ru liner substrate and the composition and the temperature of the composition are as described above.

(Step B)

Before or after the step A1, as necessary, a step B of treating the substrate obtained by the step A1 by using a predetermined solution (hereinafter, also called "specific solution") may be performed.

Particularly, in a case where the barrier metal layer is disposed on the substrate, depending on the type of component constituting the Ru-containing wiring line or the Ru liner (hereinafter, also called "Ru-containing wiring line and the like") and component constituting the barrier metal layer, sometimes these components exhibit different dissolving abilities to the composition according to the embodiment of the present invention. In this case, it is preferable to adjust the degree of solubility of the Ru-containing wiring line and the like and the barrier metal layer by using a solution that exhibits a higher dissolving ability to the barrier metal layer.

In this respect, as the specific solution, a solution is preferable which exhibits a poor dissolving ability to the Ru-containing wiring line and the like but exhibits an excellent dissolving ability to the substance constituting the barrier metal layer.

Examples of the specific solution include a solution selected from the group consisting of a mixed solution of hydrofluoric acid and hydrogen peroxide water (FPM), a mixed solution of sulfuric acid and hydrogen peroxide water (SPM), a mixed solution of aqueous ammonia and hydrogen peroxide water (APM), and a mixed solution of hydrochloric acid and hydrogen peroxide water (HPM).

The composition of FPM is, for example, preferably in a range of "hydrofluoric acid:hydrogen peroxide water:water=1:1:1" to "hydrofluoric acid:hydrogen peroxide water:water=1:1:200" (volume ratio).

The composition of SPM is, for example, preferably in a range of "sulfuric acid:hydrogen peroxide water:water=3:1:0" to "sulfuric acid:hydrogen peroxide water:water=1:1:10" (volume ratio).

The composition of APM is, for example, preferably in a range of "aqueous ammonia:hydrogen peroxide water:water=1:1:1" to "aqueous ammonia:hydrogen peroxide water:water=1:1:30" (volume ratio).

The composition of HPM is, for example, preferably in a range of "hydrochloric acid:hydrogen peroxide water:water=1:1:1" to "hydrochloric acid:hydrogen peroxide water:water=1:1:30" (volume ratio).

The preferred compositional ratio described above means a compositional ratio determined in a case where the hydrofluoric acid is 49% by mass hydrofluoric acid, the sulfuric acid is 98% by mass sulfuric acid, the aqueous ammonia is 28% by mass aqueous ammonia, the hydrochloric acid is 37% by mass hydrochloric acid, and the hydrogen peroxide water is 31% by mass hydrogen peroxide water.

Among these, as the specific solution, from the viewpoint of dissolving ability for the barrier metal layer, SPM, APM, or HPM is preferable.

As the specific solution, from the viewpoint of reducing roughness, APM, HPM, or FPM is preferable, and APM is more preferable.

As the specific solution, from the viewpoint of excellent performance balance, APM or HPM is preferable.

In the step B, as the method of treating the substrate obtained by the step A1 by using the specific solution, a method of bringing the substrate obtained by the step A1 into contact with the specific solution is preferable.

The method of bringing the substrate obtained by the step A1 into contact with the specific solution is not particularly limited, and examples thereof include the same method as the method of bringing the substrate into contact with the composition.

The contact time between the specific solution and the substrate obtained by the step A1 is, for example, preferably 0.25 to 10 minutes, and more preferably 0.5 to 5 minutes.

In the present treatment method, the step A1 and the step B may be alternately repeated.

In a case where the steps are alternately repeated, it is preferable that each of the step A1 and the step B be performed 1 to 10 times. Furthermore, in a case where the step A1 and the step B are alternately repeated, the step performed firstly and the step performed lastly may be any of the step A1 or the step B.

(Step A2)

Examples of the step A include a step A2 of removing a Ru-containing film at the outer edge portion of a substrate, on which the Ru-containing film is disposed, by using the composition.

Figure 5:
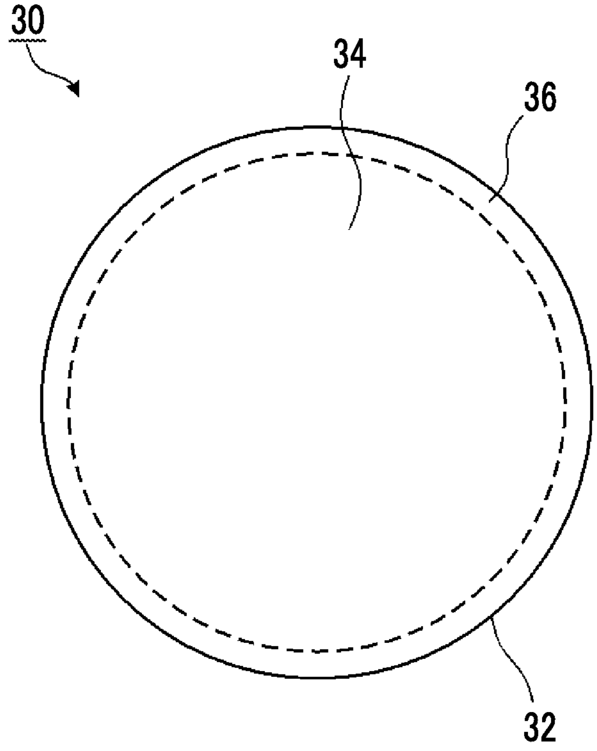
FIG. 5 is a schematic view showing an example of an object to be treated used in a step A2.

FIG. 5 is a schematic view (top view) showing an example of a substrate, on which a Ru-containing film is disposed, as an object to be treated by the step A2.

An object 30 to be treated by the step A2 shown in FIG. 5 is a laminate having a substrate 32 and a Ru-containing film 34 disposed on one main surface (entire region surrounded by the solid line) of the substrate 32. As will be described later, in step A2, the Ru-containing film 34 positioned at an outer edge portion 36 (the region outside the broken line) of the object 30 to be treated is removed.

The substrate and the Ru-containing film in the object to be treated are as described above.

It is preferable that the Ru-containing film contain simple Ru, an alloy of Ru, an oxide of Ru, a nitride of Ru, or an oxynitride of Ru.

The specific method of the step A2 is not particularly limited, and examples thereof include a method of supplying the composition from a nozzle such that the composition comes into contact with only the Ru-containing film at the outer edge portion of the substrate.

At the time of performing the treatment of the step A2, it is possible to preferably use the substrate treatment device and the substrate treatment method described in JP2010-267690A, JP2008-080288A, JP2006-100368A, and JP2002-299305A.

The method of bringing the object to be treated into contact with the composition is as described above.

The suitable ranges of the contact time between the composition and the object to be treated and the temperature of the composition are as described above.

(Step A3)

Examples of the step A include a step A3 of removing a Ru-containing substance attached to the back surface of a substrate, on which a Ru-containing film is disposed, by using the composition.

Examples of the object to be treated by the step A3 include the object to be treated used in the step A2. At the time of forming the object to be treated, which is composed of a substrate and a Ru-containing film disposed on one main surface of the substrate, used in the step A2, the Ru-containing film is formed by sputtering, CVD, or the like. At this time, sometimes a Ru-containing substance is attached to a surface (back surface) of the substrate that is opposite to the Ru-containing film. The step A3 is performed to remove such a Ru-containing substance in the object to be treated.

The specific method of the step A3 is not particularly limited, and examples thereof include a method of spraying the composition such that the composition comes into contact with only the back surface of the substrate.

The method of bringing the object to be treated into contact with the composition is as described above.

The suitable ranges of the contact time between the composition and the object to be treated and the temperature of the composition are as described above.

(Step A4)

Examples of the step A include a step A4 of removing a Ru-containing substance on a substrate, which has undergone dry etching, by using the composition.

Figure 6:
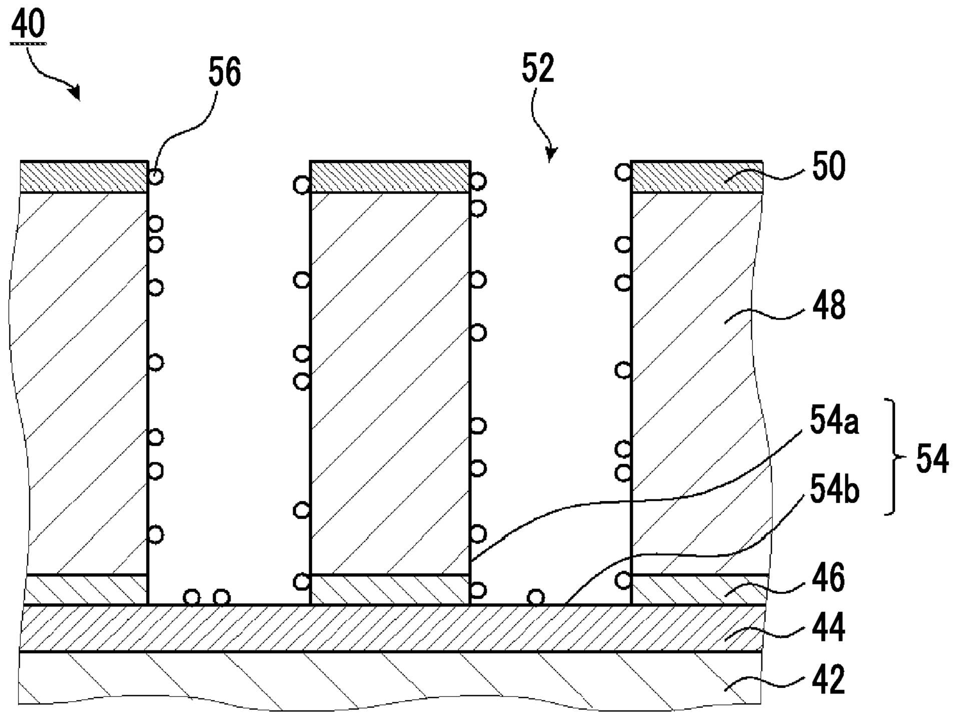
FIG. 6 is a schematic cross-sectional view showing an example of an object to be treated used in a step A4.
Figure 8:
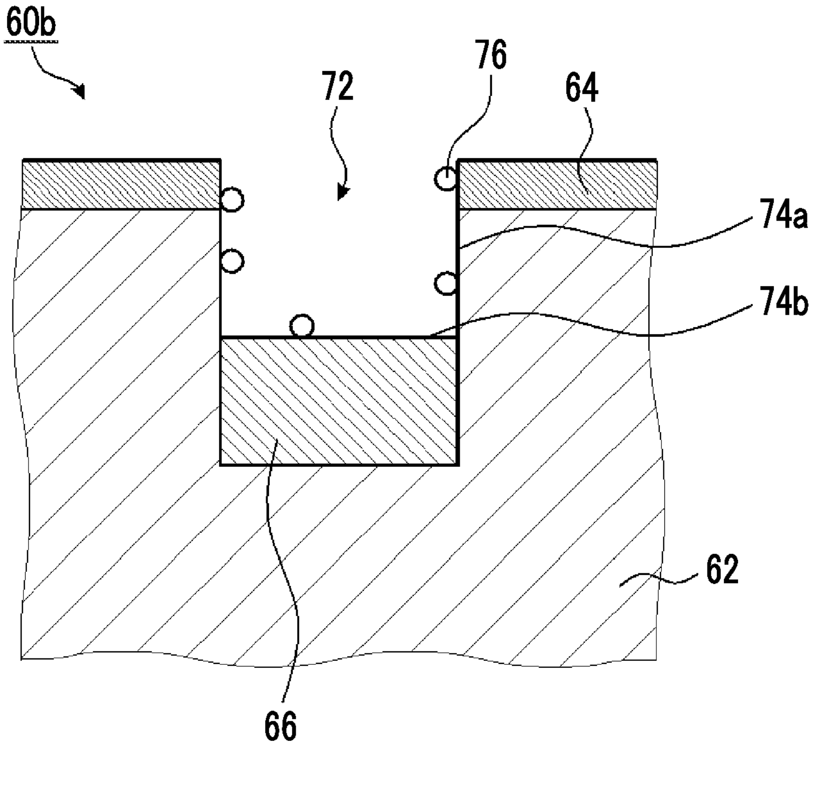
FIG. 8 is a schematic cross-sectional view showing another example of the object to be treated used in a step A4.

FIGS. 6 and 8 are a schematic view showing an example of the object to be treated by the step A4.

Hereinafter, each of drawing will be described.

An object 40 to be treated shown in FIG. 6 comprises a Ru-containing film 44, an etching stop layer 46, an interlayer insulating film 48, a metal hard mask 50 in this order on a substrate 42. Through a dry etching process or the like, a groove 52 or the like exposing the Ru-containing film 44 is formed at a predetermined position. That is, the object to be treated shown in FIG. 6 is a laminate which comprises the substrate 42, the Ru-containing film 44, the etching stop layer 46, the interlayer insulating film 48, and the metal hard mask 50 in this order and comprises the groove 52 or the like that extends from the surface of the metal hard mask 50 to the surface of the Ru-containing film 44 at the position of the opening portion of the metal hard mask 50. An interior wall 54 of the groove 52 or the like is composed of a cross-sectional wall **54*a* which includes the etching stop layer 46, the interlayer insulating film 48, and the metal hard mask 50, and a bottom wall 54*b* which consists of the exposed Ru-containing film 44. A dry etching residue 56 is attached to the interior wall 54** of the groove or the like.

The dry etching residue includes a Ru-containing substance.

Figure 7:
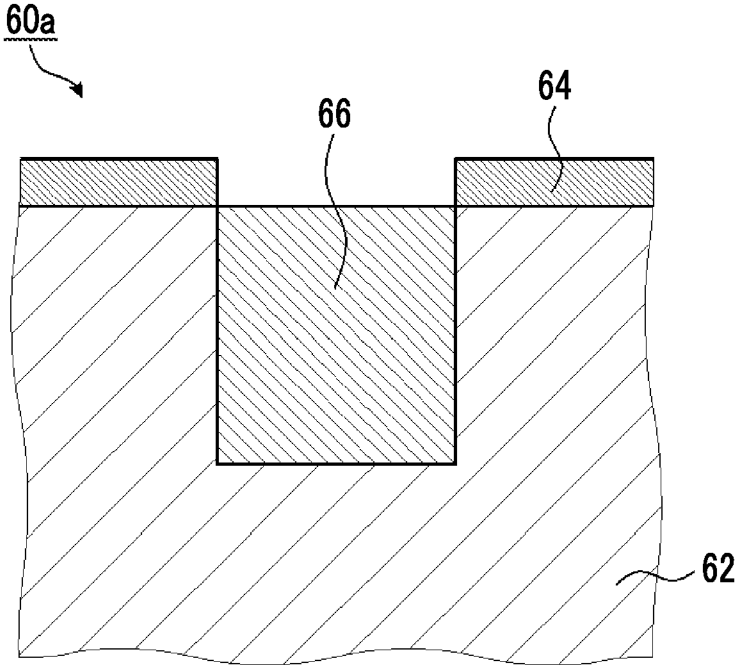
FIG. 7 is a schematic cross-sectional view showing an example of an object to be treated not yet being subjected to dry etching.

An object **60*b* to be treated shown in FIG. 8 is obtained by performing dry etching on an object to be treated not yet being subjected to dry etching shown in FIG. 7**.

An object **60*a* to be treated shown in FIG. 7 has an insulating film 62 disposed on a substrate not shown in the drawing, a Ru-containing film 66 that fills up the groove or the like formed on the insulating film 62, and a metal hard mask 64 that has an opening portion where the Ru-containing film 66 is positioned, the opening portion being disposed on the insulating film 62. The object 60*a* to be treated is obtained by forming the insulating film 62 and the metal hard mask 64 in this order on a substrate not shown in the drawing, forming a groove or the like in the insulating film 62 positioned at the opening portion of the metal hard mask 64, and then filling the grooves and the like with a Ru-containing substance to form the Ru-containing film 66**.

In a case where dry etching is performed on the object **60*a* to be treated shown in FIG. 7, the Ru-containing film is etched, and the object 60*b* to be treated shown in FIG. 8** is obtained.

The object **60*b* to be treated shown in FIG. 8 has the insulating film 62 disposed on a substrate not shown in the drawing, the Ru-containing film 66 that fills up a part of a groove 72 or the like formed in the insulating film 62, and metal hard mask 64 that has an opening portion positioned as the groove 72 or the like disposed on the insulating film 62. A dry etching residue 76 is attached to a cross-sectional wall 74*a* that consists of the insulating film 62 and the metal hard mask 64 in the groove 72 or the like and a bottom wall 74*b* that consists of the Ru-containing film 66**.

The dry etching residue includes a Ru-containing substance.

It is preferable that the Ru-containing film of the object to be treated by the step A4 contain simple Ru, an alloy of Ru, an oxide of Ru, a nitride of Ru, or an oxynitride of Ru.

It is preferable that the Ru-containing substance of the object to be treated by the step A4 contain simple Ru, an alloy of Ru, an oxide of Ru, a nitride of Ru, or an oxynitride of Ru.

A known material is selected for the interlayer insulating film and the insulating film.

A known material is selected for the metal hard mask.

Although FIGS. 6, 7, and 8 describe an aspect in which a metal hard mask is used, a resist mask formed of a known photoresist material may also be used.

Examples of the specific method of the step A4 include a method of bringing the object to be treated into contact with the composition.

The method of bringing the wiring board into contact with the composition is as described above.

The suitable ranges of the contact time between the composition and the wiring board and the temperature of the composition are as described above.

(Step A5)

Examples of the step A include a step A5 of removing a Ru-containing substance on a substrate, which has undergone a chemical mechanical polishing (CMP) treatment, by using the composition.

The CMP technique is used for smoothing an insulating film, smoothing connection holes, and a process of manufacturing damascene wiring line and the like. In some cases, a substrate having undergone CMP is contaminated with a large amount of particles used as abrasive particles, metal impurities, and the like. Therefore, it is necessary to remove these contaminants and wash the substrate before the next processing stage starts. By performing the step A5, it is possible to remove a Ru-containing substance which is generated in a case where the object to be treated by CMP includes a Ru-containing wiring line or a Ru-containing film and attached onto the substrate.

As described above, examples of the object to be treated by the step A5 include a substrate having undergone CMP that has a Ru-containing substance.

It is preferable that the Ru-containing substance contain simple Ru, an alloy of Ru, an oxide of Ru, a nitride of Ru, or an oxynitride of Ru.

Examples of the specific method of the step A5 include a method of bringing the object to be treated into contact with the composition.

The method of bringing the wiring board into contact with the composition is as described above.

The suitable ranges of the contact time between the composition and the wiring board and the temperature of the composition are as described above.

(Step A6)

Examples of the step A include a step A6 of removing a Ru-containing substance in a region other than a region where a Ru-containing film is supposed to be formed on a substrate by using the composition after a Ru-containing film is deposited on the region where a Ru-containing film is supposed to be formed on the substrate. As described above, the method of forming the Ru-containing film is not particularly limited, and the Ru-containing film can be formed on the substrate by using a sputtering method, a CVD method, an MBE method, and an ALD method.

In a case where a Ru-containing film is formed in a region where a Ru-containing film is supposed to be formed (a region where a Ru-containing film is expected to be formed) on a substrate by the above method, the Ru-containing film is also formed in a non-target site (a region other than the region where a Ru-containing film is supposed to be formed). Examples of the non-target site include a side wall of the insulating film formed by the filling of the groove or the like provided in the insulating film with the Ru-containing film.

Figure 9:
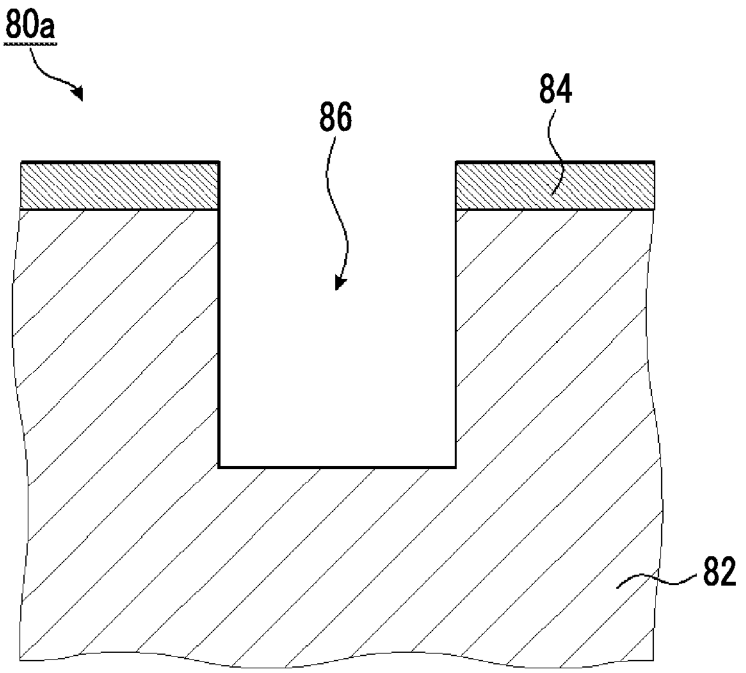
FIG. 9 is a schematic cross-sectional view showing an example of an object to be treated in which a Ru-containing film is not yet formed.
Figure 10:
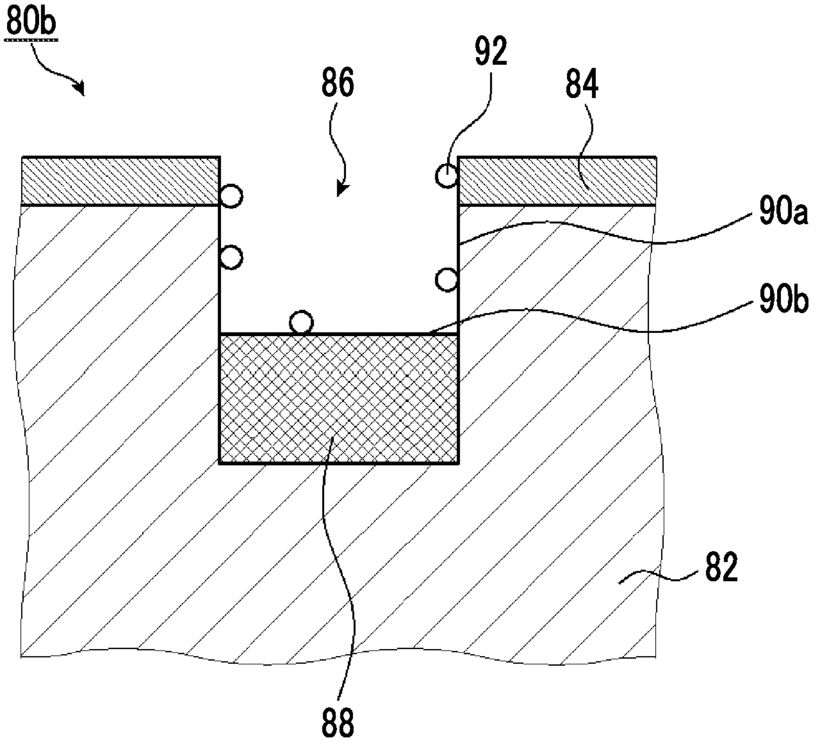
FIG. 10 is a schematic cross-sectional view showing an example of an object to be treated used in a step A6.

FIG. 10 shows an example of an object to be treated by the step A6. An object 80*b* to be treated shown in FIG. 10 is obtained by forming a Ru-containing film on an object 80*a* to be treated in which a Ru-containing film shown in FIG. 9 is not yet formed.

An object 80*a* to be treated shown in FIG. 9 has an insulating film 82 disposed on a substrate not shown in the drawing and a metal hard mask 84 disposed on the insulating film 82, and the insulating film 82 has a groove 86 or the like positioned at an opening portion of the metal hard mask 84. Forming an Ru-containing film to fill up a part of the groove 86 or the like of the object 80*a* to be treated makes it possible to obtain the object 80*b* to be treated described in FIG. 10.

The object 80*b* to be treated shown in FIG. 10 has the insulating film 82 disposed on a substrate not shown in the drawing, a Ru-containing film 88 that fills up a part of the groove 86 or the like formed in the insulating film 82, and the metal hard mask 84 that has an opening portion positioned at the groove 86 or the like disposed on the insulating film 82. A residue 92 generated during the formation of a Ru-containing film is attached to a cross-sectional wall 90*a* that consists of the insulating film 82 and the metal hard mask 84 in the groove 86 or the like and a bottom wall 90*b* that consists of the Ru-containing film 88.

In the above aspect, the region where the Ru-containing film 88 is positioned corresponds to the region where a Ru-containing film is supposed to be formed, and the cross-sectional wall 90*a* and the bottom wall 90*b* correspond to a region other than the region where a Ru-containing film is supposed to be formed.

It is preferable that the Ru-containing film contain simple Ru, an alloy of Ru, an oxide of Ru, a nitride of Ru, or an oxynitride of Ru.

It is preferable that the Ru-containing substance contain simple Ru, an alloy of Ru, an oxide of Ru, a nitride of Ru, or an oxynitride of Ru.

A known material is selected for the metal hard mask.

Although FIGS. 9 and 10 describe an aspect in which a metal hard mask is used, a resist mask formed of a known photoresist material may also be used.

Examples of the specific method of the step A6 include a method of bringing the object to be treated into contact with the composition.

The method of bringing the wiring board into contact with the composition is as described above.

The suitable ranges of the contact time between the composition and the wiring board and the temperature of the composition are as described above.

[Step C]

As necessary, the present treatment step may have a step C of performing a rinsing treatment on the substrate obtained by the step A by using a rinsing liquid after the step A.

As the rinsing liquid, for example, hydrofluoric acid (preferably 0.001% to 1% by mass hydrofluoric acid), hydrochloric acid (preferably 0.001% to 1% by mass hydrochloric acid), hydrogen peroxide water (preferably 0.5% to 31% by mass hydrogen peroxide water, and more preferably 3% to 15% by mass hydrogen peroxide water), a mixed solution of hydrofluoric acid and hydrogen peroxide water (FPM), a mixed solution of sulfuric acid and hydrogen peroxide water (SPM), a mixed solution of aqueous ammonia and hydrogen peroxide water (APM), a mixed solution of hydrochloric acid and hydrogen peroxide water (HPM), aqueous carbon dioxide (preferably 10 to 60 ppm by mass aqueous carbon dioxide), aqueous ozone (preferably 10 to 60 ppm by mass aqueous ozone), aqueous hydrogen (preferably 10 to 20 ppm by mass aqueous hydrogen), an aqueous citric acid solution (preferably a 0.01% to 10% by mass aqueous citric acid solution), acetic acid (preferably an undiluted acetic acid solution or a 0.01% to 10% by mass aqueous acetic acid solution), sulfuric acid (preferably a 1% to 10% by mass aqueous sulfuric acid solution), aqueous ammonia (preferably 0.01% to 10% by mass aqueous ammonia), isopropyl alcohol (IPA), an aqueous hypochlorous acid solution (preferably a 1% to 10% by mass aqueous hypochlorous acid solution), aqua regia preferably aqua regia obtained by mixing together 37% by mass hydrochloric acid and 60% by mass nitric acid at a volume ratio of hydrochloric acid to the nitric acid of 2.6/1.4 to 3.4/0.6), ultrapure water, nitric acid (preferably 0.001% to 1% by mass nitric acid), perchloric acid (preferably 0.001% to 1% by mass perchloric acid), an aqueous oxalic acid solution (preferably a 0.01% to 10% by mass aqueous solution), or an aqueous periodic acid solution (preferably a 0.5% to 10% by mass aqueous periodic acid solution, examples of the periodic acid include orthoperiodic acid and metaperiodic acid) is preferable.

The preferred conditions required to FPM, SPM, APM, and HPM are the same as the suitable aspects of, for example, to FPM, SPM, APM, and HPM used as the specific solution described above.

The hydrofluoric acid, nitric acid, perchloric acid, and hydrochloric acid mean aqueous solutions obtained by dissolving HF, $HNO_3$, $HClO_4$, and HCl in water respectively.

The ozonated water, aqueous carbon dioxide, and aqueous hydrogen mean aqueous solutions obtained by dissolving $O_3$, $CO_2$, and $H_a$ in water respectively.

As long as the purpose of the rinsing step is not impaired, these rinsing liquids may be used by being mixed together.

Among the above, as the rinsing liquid, from the viewpoint of further reducing chlorine remaining on the surface of the substrate after the rinsing step, aqueous carbon dioxide, aqueous ozone, aqueous hydrogen, hydrofluoric acid, an aqueous citric acid solution, hydrochloric acid, sulfuric acid, aqueous ammonia, hydrogen peroxide water, SPM, APM, HPM, IPA, an aqueous hypochlorous acid solution, aqua regia, or FPM is preferable, and hydrofluoric acid, hydrochloric acid, hydrogen peroxide water, SPM, APM, HPM, or FPM is more preferable.

Examples of the specific method of the step C include a method of bringing the substrate as an object to be treated obtained by the step A into contact with the rinsing liquid.

The method of bringing the substrate into contact with the rinsing liquid is performed by immersing the substrate in the rinsing liquid put in a tank, spraying the rinsing liquid on the substrate, causing the rinsing liquid to flow on the substrate, or a method composed of an any combination of these.

The treatment time (contact time between the rinsing liquid and the object to be treated) is not particularly limited, and is 5 seconds to 5 minutes for example.

The temperature of the rinsing liquid during the treatment is not particularly limited. Generally, the temperature of the rinsing liquid is preferably 16° C. to 60° C., and more preferably 18° C. to 40° C. In a case where SPM is used as the rinsing liquid, the temperature thereof is preferably 90° C. to 250° C.

[Step D]

As necessary, the present treatment method may have a step D of performing a drying treatment after the step C.

The method of the drying treatment is not particularly limited, and examples thereof include spin drying, causing a drying gas to flow on the substrate, heating the substrate by a heating unit (for example, heating by a hot plate or an infrared lamp), isopropyl alcohol (IPA) vapor drying, Marangoni drying, Rotagoni drying, and a combination of these.

The drying time can be appropriately changed depending on the specific method to be used. For example, the drying time is about 30 seconds to a few minutes.

[Other Steps]

The present treatment method may be performed in combination before or after other steps performed on a substrate. While being performed, the present treatment method may be incorporated into those other steps. Alternatively, while those other steps are being performed, the treatment method according to the embodiment of the present invention may be incorporated into the steps and performed.

Examples of those other steps include a step of forming structures such as a metal wire, a gate structure, a source structure, a drain structure, an insulating film, a ferromagnetic layer, and a non-magnetic layer (for example, layer formation, etching, chemical mechanical polishing, modification, and the like), a step of forming resist, an exposure step and a removing step, a heat treatment step, a washing step, and an inspection step.

The present treatment method may be performed at any stage among the back-end process (BEOL: Back end of the line), the middle process (MOL: Middle of the line), and the front-end process (FEOL: Front end of the line). It is preferable that the present treatment method be performed in a front-end process or a middle process.

EXAMPLES

Hereinafter, the present invention will be more specifically described based on examples. The materials, the amounts and ratios of the materials used, the details of treatments, the procedures of treatments, and the like shown in the following examples can be appropriately changed as long as the gist of the present invention is maintained. Therefore, the scope of the present invention is not restricted by the following examples.

Preparation of Composition

Examples and Comparative Examples

Orthoperiodic acid, B-1: tetraethylammonium hydroxide, and 2: triethylamine were added to ultrapure water such that the contents thereof are as described in Tables 1 to 4 that will be described later, thereby obtaining a mixed solution. Then, the mixed solution was thoroughly stirred with a stirrer, thereby obtaining a composition of Example 1.

The compositions of Examples 2 to 75 and the compositions of Comparative Examples 1 to 4 were prepared in the same procedure as in Example 1, except that the types and amounts of the components were changed according to Tables 1 to 4.

In the compositions described in examples and comparative examples, the remainder other than the components shown in the tables is water.

In Table 4, the symbol of "-" listed for Comparative Examples 1 to 4 tells that the corresponding component was not added.

All of the main components described in Tables 1 to 4 were substances classified as a semiconductor grade or classified as high-purity grade equivalent to the semiconductor grade.

Hereinafter, each component listed in Tables 1 to 4 will be specifically described.

[Periodic Acid Compound]
Orthoperiodic acid
Metaperiodic acid
Sodium orthoperiodate
Potassium orthoperiodate
Sodium metaperiodate

[Specific Quaternary Ammonium Salt]
A-1: Tetramethylammonium hydroxide
A-3: Tetramethylammonium bromide
B-1: tetraethylammonium hydroxide
B-2: tetraethylammonium chloride
C-1: Tetrabutylammonium hydroxide
D-1: Ethyltrimethylammonium hydroxide
D-2: Ethyltrimethylammonium chloride
E-1: Diethyldimethylammonium hydroxide
E-2: Diethyldimethylammonium chloride
F-1: Methyltriethylammonium hydroxide
F-2: Methyltriethylammonium chloride
G-1: Trimethyl(hydroxyethyl)ammonium hydroxide
G-2: Trimethyl(hydroxyethyl)ammonium chloride
H-2: Methyltributylammonium chloride
I-4: Dimethyldibutylammonium fluoride
J-1: Benzyltrimethylammonium hydroxide
J-3: Benzyltrimethylammonium bromide
K-1: Benzyltriethylammonium hydroxide
L-3: Triethyl(hydroxyethyl)ammonium bromide
M-2: Dodecyltrimethylammonium chloride
N-4: Tetradecyltrimethylammonium fluoride
O-2: Hexadecyltrimethylammonium chloride

[Trialkylamine]
1: Trimethylamine
2: Triethylamine
3: Diethylmethylamine
4: Ethyldimethylamine
5: Tri-n-butylamine
6: Dimethylhydroxyethylamine
7: Dimethylpropylamine
8: Benzyldimethylamine
9: Benzyldiethylamine
10: Diethylhydroxyethylamine
11: Dodecyldimethylamine
12: Tetradecyldimethylamine
13: Hexadecyldimethylamine
14: N-methyldiethanolamine

[Solvent]
Ultrapure water

[Compound X]
As the compound X having at least one anion selected from the group consisting of $IO_3^-$, $I^-$, and $I_3^-$, a compound which is a combination of the following quaternary ammonium cation and an anion was used. For example, in Example 1, a compound having "B: Tetraethylammonium cation" as a cation and "$IO_3^-$" as an anion was used.
A: Tetramethylammonium cation
B: Tetraethylammonium cation
C: Tetrabutylammonium cation
D: Ethyltrimethylammonium cation
E: Diethyldimethylammonium cation
F: Methyltriethylammonium cation
G: Trimethyl(hydroxyethyl)ammonium cation
H: Methyltributylammonium cation
I Dimethyldipropylammonium cation
J Benzyltrimethylammonium cation
K: Benzyltriethylammonium cation
L: Triethyl(hydroxyethyl)ammonium cation
M: Dodecyltrimethylammonium cation
N: Tetradecyltrimethylammonium cation
O: Hexadecyltrimethylammonium cation
Proton: Proton (H+)

Test

[Ru Residue Removability]
Substrates were prepared in which a Ru layer (layer composed of simple Ru) was formed on one surface of a commercially available silicon wafer (diameter: 12 inches) by a PVD method.

The thickness of the Ru layer checked by XRF (AZX400 manufactured by Rigaku Corporation) was 30 nm.

Each of the obtained substrates was put in a container filled with the composition of each of the examples or comparative examples, and the composition was stirred to perform a Ru layer removal treatment for 2 minutes. The temperature of the composition was 25° C.

The treated substrate was observed with a scanning electron microscope (S-4800, manufactured by Hitachi High-Tech Corporation). The substrate was observed from directly above the surface on which the Ru layer was formed. In this way, a reflection electron image was obtained at 200,000× magnification (visual field: 0.5 m×0.6 m). From the obtained image, an area of a site exhibiting a bright contrast was calculated as a site where the Ru residue remains, a ratio X % of the site where the Ru residue remains to the observed area was determined to calculate a Ru residue removability (100%–X %).

The Ru residue removability was evaluated according to the following evaluation standard. The evaluation results are shown in Tables 1 to 4.

(Evaluation Standard for Ru Residue Removability)
5: The Ru film removal rate is 100%.
4: The Ru film removal rate is 80% or more and less than 100%.
3: The Ru film removal rate is 60% or more and less than 80%.
2: The Ru film removal rate is 40% or more and less than 60%.
1: The Ru film removal rate is less than 40%.

[Particle Suppressiveness]
The amount of particles in the composition of each example or each comparative example was evaluated using a particle counter (KS-42A manufactured by RION Co., Ltd.).

What were measured were particles having a size of 0.10 m or more.

The particle suppressiveness was evaluated according to the following evaluation standard. The evaluation results are shown in Tables 1 to 4.

(Evaluation Standard for Particle Suppressiveness)
4: Less than 100 particles/mL
3: 100 or more and less than 500 particles/mL
2: 500 or more and less than 2,000 particles/mL
1: 2,000 particles or more/mL Each Description in the Tables is as Follows.

"Content" of each component represents the content of each component with respect to the total mass of the composition.

In a case where one column in each table has description divided by "/", in a column of type of compound or the like, such a description means that a plurality of compounds described is added. Furthermore, in a column of content of a compound, such a description shows the contents of a plurality of compounds described on the left in the column.

Regarding "Condition X" in the column of Trialkylamine (C), "A" is listed in a case where $R^1$, $R^2$, and $R^3$ in Formula (1) each independently represent an alkyl group having 1 to 4 carbon atoms without a substituent, and "B" is listed in other cases.

In a case where two symbols are described in the column of "Cation" of the column of Compound X (D), the symbols show that the compound X includes a compound which is a combination of a cation and an anion derived from these two symbols.

"C/D" in Compound X (D) represents the ratio of the mass of the trialkylamine to the mass of the compound X.

The notation of "E−n" in the numerical value in the column of "C/D" means "$\times 10^{-n}$", and the notation of "E+n" means "$\times 10^{n}$". n represents an integer.

The notation of "-" in a column in which numerical values are described shows that the compound or the like is not added or the value cannot be calculated.

Each of numerical values described in the columns of Ru residue removability and Particle suppressiveness shows the result of evaluation carried out based on the above standard.

TABLE 1

| | Periodic acid compound (A) | | Specific quaternary ammonium salt (B) | | | Trialkylamine (C) | | |
|---|---|---|---|---|---|---|---|---|
| | Type | Content (% by mass) | Type | Number of carbon atoms | Content (% by mass) | Type | Condition X | Content (ppm) |
| Example 1 | Orthoperiodic acid | 1.5 | B-1 | 8 | 0.7 | 2 | A | 10 |
| Example 2 | Orthoperiodic acid | 0.5 | D-1 | 5 | 0.2 | 1 | A | 1 |
| Example 3 | Metaperiodic acid | 1 | B-2 | 8 | 0.3 | 2 | A | 2 |
| Example 4 | Metaperiodic acid | 2 | D-1 | 5 | 1 | 4 | A | 5 |
| Example 5 | Orthoperiodic acid | 0.7 | A-3 | 4 | 0.2 | 1 | A | 0.05 |
| Example 6 | Orthoperiodic acid | 1.2 | E-2 | 6 | 0.3 | 3 | A | 0.7 |
| Example 7 | Orthoperiodic acid | 0.8 | F-1 | 7 | 0.5 | 2 | A | 2 |
| Example 8 | Metaperiodic acid | 1.6 | G-2 | 5 | 0.6 | 1 | A | 12 |
| Example 9 | Orthoperiodic acid | 0.5 | I-4 | 8 | 0.2 | 7 | A | 16 |
| Example 10 | Orthoperiodic acid | 0.1 | L-3 | 8 | 0.05 | 10 | B | 0.1 |
| Example 11 | Metaperiodic acid | 1.8 | C-1 | 16 | 0.6 | 5 | A | 0.3 |
| Example 12 | Orthoperiodic acid | 2 | H-2 | 13 | 1.8 | 5 | A | 500 |
| Example 13 | Orthoperiodic acid | 1.2 | J-3 | 10 | 0.9 | 8 | B | 300 |
| Example 14 | Orthoperiodic acid | 0.5 | K-1 | 13 | 0.2 | 9 | B | 40 |
| Example 15 | Orthoperiodic acid | 0.6 | M-2 | 15 | 0.08 | 11 | B | 0.01 |
| Example 16 | Metaperiodic acid | 0.1 | N-4 | 17 | 0.02 | 12 | B | 0.05 |
| Example 17 | Orthoperiodic acid | 0.4 | O-2 | 19 | 0.1 | 13 | B | 0.6 |
| Example 18 | Orthoperiodic acid | 1 | D-2 | 5 | 0.1 | 1 | A | 0.1 |
| Example 19 | Orthoperiodic acid | 1.6 | D-1 | 5 | 1.1 | 4 | A | 200 |
| Example 20 | Metaperiodic acid | 2 | E-1 | 6 | 0.8 | 4 | A | 100 |
| Example 21 | Orthoperiodic acid | 0.8 | F-2 | 7 | 0.4 | 3 | A | 2 |

| | | Compound X (D) | | | | | |
|---|---|---|---|---|---|---|---|
| | pH | Cation | Anion | Content (ppm) | C/D | Ru residue removability | Particle suppresiveness |
| Example 1 | 6.5 | B | $IO_3^-$ | 120 | 8.3E−02 | 5 | 4 |
| Example 2 | 5.8 | D | $IO_3^-$ | 50 | 2.0E−02 | 5 | 4 |
| Example 3 | 4.2 | B | $I^-$ | 100 | 2.0E−02 | 5 | 4 |
| Example 4 | 4.6 | Proton | $I^-$ | 25 | 2.0E−01 | 5 | 4 |
| Example 5 | 4.5 | A | $IO_3^-$ | 0.04 | 1.3E+00 | 5 | 4 |
| Example 6 | 4.3 | E | $I_3^-$ | 80 | 8.8E−03 | 5 | 4 |
| Example 7 | 7.8 | F | $I^-$ | 65 | 3.1E−02 | 5 | 4 |
| Example 8 | 5.6 | G | $IO_3^-$ | 50 | 2.4E−01 | 5 | 4 |
| Example 9 | 6.2 | I | $IO_3^-$ | 0.005 | 3.2E+03 | 5 | 4 |
| Example 10 | 6.9 | L | $I^-$ | 0.0001 | 1.0E−03 | 4 | 4 |
| Example 11 | 4.1 | C | $I^-$ | 500 | 6.0E−04 | 4 | 4 |
| Example 12 | 7.5 | H | $I^-$ | 0.1 | 5.0E−03 | 4 | 4 |
| Example 13 | 6.8 | J | $IO_3^-$ | 0.01 | 3.0E+04 | 3 | 4 |
| Example 14 | 6.5 | K | $I^-$ | 0.002 | 2.0E+04 | 3 | 4 |
| Example 15 | 4.9 | M | $I^-$ | 0.002 | 5.0E+00 | 3 | 4 |
| Example 16 | 5.2 | N | $IO_3^-$ | 0.0002 | 2.3E+02 | 2 | 4 |
| Example 17 | 7.5 | O | $IO_3^-$ | 130 | 4.6E−03 | 2 | 4 |
| Example 18 | 4.4 | D | $I^-$ | 600 | 1.7E−04 | 5 | 4 |
| Example 19 | 6.3 | Proton | $I_3^-$ | 200 | 1.0E−00 | 5 | 4 |
| Example 20 | 4.2 | E | $I^-$ | 300 | 3.3E−01 | 5 | 4 |
| Example 21 | 5.2 | F | $IO_3^-$ | 40 | 5.0E−02 | 5 | 4 |

TABLE 2

| | Periodic acid compound (A) | | Specific quaternary ammonium salt (B) | | | Trialkylamine (C) | | |
|---|---|---|---|---|---|---|---|---|
| | Type | Content (% by mass) | Type | Number of carbon atoms | Content (% by mass) | Type | Condition X | Content (ppm) |
| Example 22 | Orthoperiodic acid | 1.4 | G-2 | 5 | 0.8 | 6 | B | 85 |
| Example 23 | Orthoperiodic acid | 0.7 | J-1 | 10 | 0.05 | 8 | B | 0.6 |
| Example 24 | Metaperiodic acid | 1 | D-1 | 5 | 0.4 | 1/4 | A | 55 |
| Example 25 | Orthoperiodic acid | 1.2 | D-2 | 5 | 0.9 | 1/4 | A | 450 |
| Example 26 | Metaperiodic acid | 1.4 | E-1 | 6 | 0.5 | 3/4 | A | 45 |
| Example 27 | Orthoperiodic acid | 1.3 | F-1 | 7 | 0.9 | 2/3 | A | 20 |
| Example 28 | Orthoperiodic acid | 1.5 | G-1 | 5 | 1.1 | 1/6 | A/B | 1500 |
| Example 29 | Metaperiodic acid | 1.2 | J-1 | 10 | 0.8 | 1/8 | A/B | 120 |
| Example 30 | Orthoperiodic acid | 1 | B-1 | 8 | 0.01 | 2 | A | 0.002 |
| Example 31 | Orthoperiodic acid | 1 | A-1 | 4 | 0.15 | 1 | A | 0.03 |
| Example 32 | Metaperiodic acid | 1 | D-1 | 5 | 0.2 | 1/4 | A | 0.3 |
| Exampic 33 | Orthoperiodic acid | 1 | D-1 | 5 | 0.35 | 4 | A | 13 |
| Example 34 | Orthoperiodic acid | 1 | A-1 | 4 | 0.5 | 1 | A | 50 |
| Example 35 | Orthoperiodic acid | 1 | B-1 | 8 | 0.8 | 2 | A | 140 |
| Example 36 | Orthoperiodic acid | 1 | D-1 | 5 | 0.85 | 1/4 | A | 160 |
| Example 37 | Orthoperiodic acid | 1 | A-1 | 4 | 1 | 1 | A | 230 |
| Example 38 | Metaperiodic acid | 1 | D-1 | 5 | 1.2 | 1 | A | 240 |
| Example 39 | Orthoperiodic acid | 1 | D-1 | 5 | 1.5 | 1/4 | A | 105 |
| Example 40 | Orthoperiodic acid | 0.005 | D-1 | 5 | 0.009 | 1/4 | A | 0.0001 |
| Example 41 | Orthoperiodic acid | 0.01 | D-1 | 5 | 0.01 | 1/4 | A | 0.01 |
| Example 42 | Metaperiodic acid | 0.06 | A-1 | 4 | 0.05 | 1 | A | 0.16 |
| Example 43 | Orthoperiodic acid | 0.1 | B-1 | 8 | 0.03 | 2 | A | 0.05 |

| | | Compound X (D) | | | | | |
|---|---|---|---|---|---|---|---|
| | pH | Cation | Anion | Content (ppm) | C/D | Ru residue removability | Particle suppresiveness |
| Example 22 | 5.8 | G | $IO_3^-$ | 85 | 1.0E−00 | 4 | 4 |
| Example 23 | 4.1 | I | $I^-$ | 5 | 1.2E−01 | 3 | 4 |
| Example 24 | 6.2 | D | $IO_3^-$ | 6000 | 9.2E−03 | 5 | 4 |
| Example 25 | 7.1 | Proton | $IO_3^-$ | 200 | 2.3E+00 | 5 | 4 |
| Example 26 | 4.8 | E | I | 1000 | 4.5E−01 | 5 | 4 |
| Example 27 | 6.3 | F | $I_3^-$ | 500 | 4.0E−02 | 5 | 4 |
| Example 28 | 7.3 | G | $I^-$ | 240 | 6.3E+00 | 5 | 4 |
| Example 29 | 7.1 | J | $IO_3^-$ | 300 | 4.0E−01 | 4 | 4 |
| Example 30 | 1 | Proton | $I^-$ | 450 | 4.4E−06 | 2 | 2 |
| Example 31 | 1.5 | A | $I^-$ | 100 | 3.0E−04 | 2 | 4 |
| Example 32 | 2.6 | Proton | $I^-$ | 250 | 1.2E−03 | 3 | 4 |
| Exampic 33 | 3.1 | Proton | $IO_3^-$ | 300 | 4.3E−02 | 4 | 4 |
| Example 34 | 3.7 | A | $I^-$ | 750 | 6.7E−02 | 4 | 4 |
| Example 35 | 8.2 | B | $IO_3^-$ | 1000 | 1.4E−01 | 4 | 4 |
| Example 36 | 8.9 | D | $I^-$ | 600 | 2.7E−01 | 4 | 4 |
| Example 37 | 9.5 | A | $I^-$ | 200 | 1.2E−00 | 4 | 4 |
| Example 38 | 11 | D | $IO_3^-$ | 400 | 6.0E−01 | 3 | 4 |
| Example 39 | 12 | D | $I^-$ | 100 | 1.1E−00 | 2 | 4 |
| Example 40 | 7.6 | D | $I^-$ | 0.001 | 1.0E−01 | 2 | 4 |
| Example 41 | 7.6 | D | $IO_3^-$ | 0.005 | 2.0E+00 | 4 | 4 |
| Example 42 | 7.5 | A | $I^-$ | 20 | 8.0E−03 | 4 | 4 |
| Example 43 | 5.3 | B | $I^-$ | 0.0001 | 5.0E+02 | 5 | 4 |

TABLE 3

| | Periodic acid compound (A) | | Specific quaternary ammonium salt (B) | | | Trialkylamine (C) | | |
|---|---|---|---|---|---|---|---|---|
| | Type | Content (% by mass) | Type | Number of carbon atoms | Content (% by mass) | Type | Condition X | Content (ppm) |
| Example 44 | Orthoperiodic acid | 1.6 | D-1 | 5 | 0.7 | 4 | A | 0.06 |
| Example 45 | Metaperiodic acid | 2.1 | A-1 | 4 | 1 | 1 | A | 350 |
| Example 46 | Orthoperiodic acid | 4.5 | D-1 | 5 | 1.8 | 4 | A | 450 |
| Example 47 | Orthoperiodic acid | 5.2 | D-1 | 5 | 2.8 | 4 | A | 1600 |
| Example 48 | Metaperiodic acid | 10 | D-1 | 5 | 3.8 | 4 | A | 2000 |
| Example 49 | Orthoperiodic acid | 0.001 | A-1 | 4 | 0.0005 | 1 | A | 0.00001 |
| Example 50 | Orthoperiodic acid | 0.01 | B-1 | 8 | 0.002 | 2 | A | 0.0002 |

TABLE 3-continued

| | | | | | | | | |
|---|---|---|---|---|---|---|---|---|
| Example 51 | Orthoperiodic acid | 0.08 | D-1 | 5 | 0.008 | 4 | A | 0.0004 |
| Example 52 | Orthoperiodic acid | 0.1 | A-1 | 4 | 0.01 | 1 | A | 0.005 |
| Example 53 | Metaperiodic acid | 1.8 | D-1 | 5 | 1 | 4 | A | 230 |
| Example 54 | Orthoperiodic acid | 2 | D-1 | 5 | 2 | 4 | A | 980 |
| Example 55 | Orthoperiodic acid | 2.5 | A-1 | 4 | 2.1 | 1 | A | 1200 |
| Example 56 | Orthoperiodic acid | 4.5 | B-1 | 8 | 3.6 | 2 | A | 2000 |
| Example 57 | Orthoperiodic acid | 4.6 | D-1 | 5 | 4.8 | 4 | A | 5000 |
| Example 58 | Metaperiodic acid | 5 | D-1 | 5 | 5.2 | 4 | A | 15000 |
| Example 59 | Orthoperiodic acid | 5.6 | D-1 | 5 | 6 | 4 | A | 16000 |
| Example 60 | Orthoperiodic acid/ Metaperiodic acid | 0.2/ 0.3 | D-1 | 5 | 0.26 | 4 | A | 0.06 |
| Example 61 | Orthoperiodic acid/ Metaperiodic acid | 0.001/ 0.449 | A-1 | 4 | 0.25 | 1 | A | 0.1 |
| Example 62 | Orthoperiodic acid/ Metaperiodic acid | 0.01/ 0.49 | B-1 | 8 | 0.21 | 2 | A | 0.07 |

| | | Compound X (D) | | | | | |
|---|---|---|---|---|---|---|---|
| | pH | Cation | Anion | Content (ppm) | C/D | Ru residue removability | Particle suppresiveness |
| Example 44 | 6.2 | Proton | $IO_3^-$ | 15000 | 4.0E−06 | 5 | 2 |
| Example 45 | 5.6 | A | $I^-$ | 20000 | 1.8E−02 | 4 | 3 |
| Example 46 | 4.3 | D | $IO_3^-$ | 1000 | 4.5E−01 | 4 | 3 |
| Example 47 | 5.5 | D | $I^-$ | 10000 | 1.6E−01 | 5 | 2 |
| Example 48 | 4.6 | D | $IO_3^-$ | 20000 | 1.0E−01 | 5 | 2 |
| Example 49 | 5.8 | A | $I^-$ | 0.0001 | 1.0E−01 | 2 | 4 |
| Example 50 | 4.5 | B | $I^-$ | 0.02 | 1.0E−02 | 3 | 4 |
| Example 51 | 4.2 | Proton | $IO_3^-$ | 1 | 4.0E−04 | 3 | 4 |
| Example 52 | 4.3 | A | $I^-$ | 10 | 5.0E−04 | 5 | 4 |
| Example 53 | 6.5 | D | $IO_3^-$ | 0.02 | 1.2E+04 | 5 | 4 |
| Example 54 | 7.9 | D | $I^-$ | 1200 | 3.2E−01 | 5 | 4 |
| Example 55 | 7.9 | A | $I^-$ | 800 | 1.5E+00 | 4 | 3 |
| Example 56 | 6.7 | Proton | $IO_3^-$ | 0.01 | 2.0E+05 | 4 | 1 |
| Example 57 | 7.4 | D | $I^-$ | 10000 | 5.0E−01 | 4 | 3 |
| Example 58 | 7.9 | D | $IO_3^-$ | 14000 | 1.1E+00 | 3 | 2 |
| Example 59 | 7.6 | D | $I^-$ | 100000 | 1.6E−01 | 3 | 1 |
| Example 60 | 4.6 | D | $IO_3^-$ | 240 | 2.1E−04 | 5 | 4 |
| Example 61 | 4.7 | A | $I^-$ | 600 | 1.7E−04 | 5 | 4 |
| Example 62 | 4.2 | Proton | $I^-$ | 40 | 1.8E−03 | 5 | 4 |

TABLE 4

| | Periodic acid compound (A) | | Specific quaternary ammonium salt (B) | | | Trialkylamine (C) | | |
|---|---|---|---|---|---|---|---|---|
| | Type | Content (% by mass) | Type | Number of carbon atoms | Content (% by mass) | Type | Condition X | Content (ppm) |
| Example 63 | Orthoperiodic acid | 0.5 | B-1/D-1 | 8/5 | 0.1/0.1 | 1/2/4 | A | 0.5 |
| Example 64 | Orthoperiodic acid | 0.5 | A-1/D-1 | 4/5 | 0.01/0.25 | 1/4 | A | 0.1 |
| Example 65 | Metaperiodic acid | 0.5 | A-1/E-1 | 4/6 | 0.001/0.24 | 1/3/4 | A | 0.05 |
| Example 66 | Orthoperiodic acid | 0.5 | D-1/E-1/ B-1 | 5/6/8 | 0.05/0.01/ 0.15 | 1/2/4 | A | 0.6 |
| Example 67 | Orthoperiodic acid | 0.5 | D-1 | 5 | 0.3 | 4 | A | 5 |
| Example 68 | Orthoperiodic acid | 0.5 | B-1 | 8 | 0.3 | 2 | A | 0.5 |
| Example 69 | Metaperiodic noid | 0.5 | A-1 | 4 | 0.3 | 1 | A | 1 |
| Example 70 | Sodium orthoperiodate | 1.5 | D-1 | 5 | 0.9 | 4 | A | 8 |
| Example 71 | Potassium orthoperiodate | 1 | B-1 | 8 | 0.25 | 2 | A | 0.5 |
| Example 72 | Sodium metaperiodate | 1.5 | D-1 | 5 | 0.45 | 4 | A | 3 |
| Example 73 | Orthoperiodic acid/ Sodium orthoperiodate | 1.0/ 0.5 | B-1 | 8 | 0.78 | 2 | A | 1 |
| Example 74 | Sodium metaperiodate | 1 | D-1 | 5 | 0.45 | 14 | B | 60 |
| Example 75 | Sodium metaperiodate | 1 | G-1 | 5 | 0.26 | 14 | B | 0.4 |
| Comparative Example 1 | Orthoperiodic acid | 0.5 | B-1 | 8 | 0.01 | — | — | — |
| Comparative Example 2 | Orthoperiodic acid | 1.0 | D-2 | 5 | 0.01 | — | — | — |
| Comparative Example 3 | — | — | B-1 | 8 | 1.0 | 2 | A | 0.08 |
| Comparative Example 4 | Metaperiodic acid | 0.5 | — | — | — | — | — | — |

TABLE 4-continued

| | pH | Compound X (D) Cation | Anion | Content (ppm) | C/D | Ru residue removability | Particle suppresiveness |
|---|---|---|---|---|---|---|---|
| Example 63 | 4.6 | B, D | $IO_3^-$ | 450 | 1.1E−03 | 5 | 4 |
| Example 64 | 4.8 | A, D | $I^-$ | 150 | 6.7E−04 | 5 | 4 |
| Example 65 | 4.5 | A, E | $I_3^-$ | 0.5 | 1.0E−01 | 5 | 4 |
| Example 66 | 4.7 | B, D, E | $I^-$ | 0.001 | 6.0E+02 | 5 | 4 |
| Example 67 | 6.8 | B | $I^-$ | 0.1 | 5.0E+01 | 5 | 4 |
| Example 68 | 6.8 | D | $IO_3^-$ | 0.5 | 1.0E+00 | 5 | 4 |
| Example 69 | 6.7 | B | $I_3^-$ | 0.4 | 2.5E+00 | 5 | 4 |
| Example 70 | 6.8 | D | $I^-$ | 150 | 5.3E−02 | 5 | 4 |
| Example 71 | 5.5 | B | $IO_3^-$ | 100 | 5.0E−03 | 5 | 4 |
| Example 72 | 6 | D | $I^-$ | 250 | 1.2E−02 | 5 | 4 |
| Example 73 | 6.3 | B | $IO_3^-$ | 50 | 2.0E−02 | 5 | 4 |
| Example 74 | 6.1 | D | $I^-$ | 3000 | 2.0E−02 | 4 | 4 |
| Example 75 | 5.5 | Proton | $IO_3^-$ | 150 | 2.7E−03 | 4 | 4 |
| Comparative Example 1 | 4.1 | B | $I^-$ | 10 | — | 1 | 2 |
| Comparative Example 2 | 3.8 | D | $IO_3^-$ | 100 | — | 1 | 1 |
| Comparative Example 3 | 9.8 | B | $I^-$ | 0.5 | 1.6E−01 | 1 | 1 |
| Comparative Example 4 | 1.5 | Proton | $I^-$ | 0.2 | — | 1 | 1 |

From the results of Tables 1 to 4, by comparing the results of examples and comparative examples, it has been confirmed that the composition according to the embodiment of the present invention has an excellent Ru residue removability. Furthermore, it has been confirmed that the composition according to the embodiment of the present invention has excellent particle suppressiveness.

From the results of Examples 1 to 17, it has been confirmed that the effect of the present invention is further improved in a case where the total number of carbon atoms contained in the specific quaternary ammonium salt is 4 to 16 (preferably 4 to 8).

By the comparison of Examples 1 to 23, it has been confirmed that the effect of the present invention is further improved in a case where $R^1$, $R^2$, and $R^3$ in Formula (1) each independently represent an alkyl group having 1 to 4 carbon atoms without a substituent.

By the comparison of Examples 1 to 9 and Examples 30 to 39, it has been confirmed that the effect of the present invention is further improved in a case where the pH of the composition is 2.0 to 11.0 (preferably 3.0 to 10.0, and more preferably 4.0 to 8.0).

From the results of Examples 40 to 48, it has been confirmed that the effect of the present invention is further improved in a case where the content of the periodic acid compound is 0.01% to 5.0% by mass (preferably 0.1% to 2.0% by mass) with respect to the total mass of the composition.

From the results of Examples 49 to 59, it has been confirmed that the effect of the present invention is further improved in a case where the content of the trialkylamine is 1.0 ppb by mass to 1.5% by mass (preferably 1.0 ppb by mass to 0.2% by mass).

From the results of Examples 30, 44, and 56, it has been confirmed that the particle suppressiveness is excellent in a case where the mass ratio of the content of the trialkylamine to the total mass of the anion in the compound having at least one anion selected from the group consisting of $IO_3^-$, $I^-$, and $I_3^-$ is $1\times10^{-5}$ to $1\times10^5$.

EXPLANATION OF REFERENCES

10*a*, 10*b*: Ru wiring board
12: insulating film
14: barrier metal layer
16: Ru-containing wiring line
18: recess
20*a*, 20*b*: Ru liner substrate
22: insulating film
24 Ru-containing liner
26: wiring part
28: recess
30: object to be treated
32: substrate
34: Ru-containing film
36: outer edge portion
40: object to be treated
42: substrate
44: Ru-containing film
46: etching stop layer
48: interlayer insulating film
50: metal hard mask
52: groove or the like
54: interior wall
54*a*: cross-sectional wall
54*b*: bottom wall
56: dry etching residue
60*a*, 60*b*: object to be treated
62: insulating film
64: metal hard mask
66: Ru-containing film
72: groove or the like
74*a*: cross-sectional wall
74*b*: bottom wall
76: dry etching residue
80*a*, 80*b*: object to be treated
82: insulating film
84: metal hard mask
86: groove or the like
88: Ru-containing film
90*a*: cross-sectional wall
90*b*: bottom wall
92: residue

What is claimed is:

1. A composition comprising:

one or more periodic acid compounds selected from the group consisting of a periodic acid and a salt thereof, a quaternary ammonium salt represented by Formula (A); and a compound having at least one anion selected from the group consisting of $IO_3^-$, $I^-$, and $I_3^-$; and a trialkylamine or a salt thereof, (A)

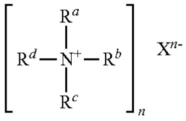

in Formula (A), $R^a$ to $R^d$ each independently represent an alkyl group which may have a substituent, n represents an integer of 1 or 2, and $X^{n-}$ represents $Br^-$, $Cl^-$, $F^-$, $CH_3COO^-$, $HSO_4^-$, $OH^-$, $NO_3^-$, or $SO_4^{2-}$, wherein a mass ratio of a content of the trialkylamine to a total mass of the anion in the compound having the anion is $1\times10^{-5}$ to $1\times10^{5}$.

2. The composition according to claim 1, wherein the composition is used for removing a ruthenium-containing substance on a substrate.

3. The composition according to claim 1, wherein the periodic acid compound includes at least one compound selected from the group consisting of orthoperiodic acid, metaperiodic acid, and salts thereof.

4. The composition according to claim 1, wherein a content of the periodic acid compound is 0.01% to 5.0% by mass with respect to a total mass of the composition.

5. The composition according to claim 1, wherein a total number of carbon atoms contained in the quaternary ammonium salt is 4 to 16.

6. The composition according to claim 1, wherein a total number of carbon atoms contained in the quaternary ammonium salt is 4 to 8.

7. The composition according to claim 1, wherein the quaternary ammonium salt includes at least one compound selected from the group consisting of a tetramethylammonium salt, a tetraethylammonium salt, a tetrabutylammonium salt, an ethyltrimethylammonium salt, a methyltriethylammonium salt, a diethyldimethylammonium salt, a methyltributylammonium salt, a dimethyldipropylammonium salt, a benzyltrimethylammonium salt, a benzyltriethylammonium salt, a trimethyl(hydroxyethyl)ammonium salt, and a triethyl(hydroxyethyl)ammonium salt.

8. The composition according to claim 1, wherein the trialkylamine or a salt thereof is a compound represented by Formula (1) or a salt thereof, (1)

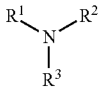

in Formula (1), $R^1$, $R^2$, and $R^3$ each independently represent an alkyl group which may have a substituent.

9. The composition according to claim 8, wherein $R^1$, $R^2$, and $R^3$ in Formula (1) each independently represent an alkyl group having 1 to 4 carbon atoms without a substituent.

10. The composition according to claim 1, wherein a content of the trialkylamine or a salt thereof is 1.0 ppb by mass to 1.5% by mass with respect to a total mass of the composition.

11. The composition according to claim 1, wherein a content of the trialkylamine or a salt thereof is 1.0 ppb by mass to 0.2% by mass with respect to a total mass of the composition.

12. The composition according to claim 1, wherein a pH of the composition is 2.0 to 11.0.

13. The composition according to claim 1, wherein a pH of the composition is 3.0 to 10.0.

14. The composition according to claim 1, wherein a pH of the composition is 4.0 to 8.0.

15. A method for treating a substrate, comprising:

a step A of removing a ruthenium-containing substance on a substrate by using the composition according to claim 1.

16. The method for treating a substrate according to claim 15, wherein the step A is a step A1 of performing a recess etching treatment on a ruthenium-containing wiring line or ruthenium-containing liner disposed on a substrate by using the composition, a step A2 of removing a ruthenium-containing film at an outer edge portion of a substrate, on which the ruthenium-containing film is disposed, by using the composition, a step A3 of removing a ruthenium-containing substance attached to a back surface of a substrate, on which a ruthenium-containing film is disposed, by using the composition, a step A4 of removing a ruthenium-containing substance on a substrate, which has undergone dry etching, by using the composition, a step A5 of removing a ruthenium-containing substance on a substrate, which has undergone a chemical mechanical polishing treatment, by using the composition, or a step A6 of removing a ruthenium-containing substance in a region other than a region where a ruthenium-containing film is supposed to be formed on a substrate by using the composition after a ruthenium-containing film is deposited on the region where a ruthenium-containing film is supposed to be formed on the substrate.

17. The composition according to claim 2, wherein the periodic acid compound includes at least one compound selected from the group consisting of orthoperiodic acid, metaperiodic acid, and salts thereof.

18. The composition according to claim 2, wherein a content of the periodic acid compound is 0.01% to 5.0% by mass with respect to a total mass of the composition.

19. A composition comprising:

one or more periodic acid compounds selected from the group consisting of a periodic acid and a salt thereof;

a quaternary ammonium salt represented by Formula (A); and a trialkylamine or a salt thereof, (A)

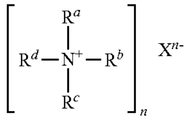

in Formula (A), $R^a$ to $R^a$ each independently represent an alkyl group which may have a substituent, n represents an integer of 1 or 2, and $X^{n-}$represents $Br^-$, $Cl^-$, $F^-$, $CH_3COO^-$, $HSO_4^-$, $OH^-$, $NO_3^-$, or $SO_4^{2-}$, wherein a content of the trialkylamine or a salt thereof is 1.0 ppb by mass to 1.5% by mass with respect to a total mass of the composition, and a pH of the composition is 4.0 to 8.0.

* * * * *